(12) United States Patent
Yu et al.

(10) Patent No.: US 10,505,009 B2
(45) Date of Patent: Dec. 10, 2019

(54) SEMICONDUCTOR DEVICE WITH FIN-TYPE PATTERNS

(71) Applicant: SAMSUNG ELECTRONICS CO., LTD., Suwon-si, Gyeonggi-do (KR)

(72) Inventors: Hyun Kwan Yu, Suwon-si (KR); Kyung Ho Kim, Seoul (KR); Dong Suk Shin, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/294,158

(22) Filed: Mar. 6, 2019

(65) Prior Publication Data

US 2019/0207008 A1 Jul. 4, 2019

Related U.S. Application Data

(63) Continuation of application No. 15/479,459, filed on Apr. 5, 2017, now Pat. No. 10,243,056.

(30) Foreign Application Priority Data

May 31, 2016 (KR) .................. 10-2016-0067531

(51) Int. Cl.
*H01L 29/49* (2006.01)
*H01L 21/8238* (2006.01)
*H01L 27/11* (2006.01)
*H01L 29/06* (2006.01)
*H01L 29/08* (2006.01)
(Continued)

(52) U.S. Cl.
CPC .. *H01L 29/4983* (2013.01); *H01L 21/823418* (2013.01); *H01L 21/823431* (2013.01); *H01L 21/823468* (2013.01); *H01L 21/823878* (2013.01); *H01L 27/0886* (2013.01); *H01L 27/1104* (2013.01); *H01L 29/0649* (2013.01); *H01L 29/0847* (2013.01); *H01L 29/161* (2013.01); *H01L 29/165* (2013.01); *H01L 29/1608* (2013.01); *H01L 29/66545* (2013.01); *H01L 29/785* (2013.01); *H01L 29/7848* (2013.01); *H01L 21/823814* (2013.01); *H01L 21/823821* (2013.01); *H01L 21/823864* (2013.01); *H01L 27/0924* (2013.01)

(58) Field of Classification Search
CPC ......... H01L 29/4983; H01L 21/823418; H01L 27/0886; H01L 27/1104; H01L 29/0649; H01L 29/0847; H01L 29/161; H01L 29/1608; H01L 29/66545; H01L 29/785; H01L 29/7848; H01L 21/823878; H01L 21/823468; H01L 21/823431; H01L 29/165; H01L 21/823814; H01L 27/0924; H01L 21/823864; H01L 21/823821
See application file for complete search history.

(56) References Cited

U.S. PATENT DOCUMENTS 6,316,322 B1 11/2001 Hao
7,335,581 B2 2/2008 Saitoh et al.
(Continued)

*Primary Examiner* — Selim U Ahmed
(74) *Attorney, Agent, or Firm* — Lee & Morse, P.C.

(57) ABSTRACT

A semiconductor device includes a field insulating film including a first region and a second region on a substrate, a recess in the first region of the field insulating film, a gate electrode on the second region of the field insulating film, and a gate spacer along a sidewall of the gate electrode and a sidewall of the recess.

20 Claims, 26 Drawing Sheets

(51) Int. Cl.

| | |
|---|---|
| *H01L 29/16* | (2006.01) |
| *H01L 29/161* | (2006.01) |
| *H01L 29/165* | (2006.01) |
| *H01L 29/66* | (2006.01) |
| *H01L 29/78* | (2006.01) |
| *H01L 21/8234* | (2006.01) |
| *H01L 27/088* | (2006.01) |
| *H01L 27/092* | (2006.01) |

(56) References Cited

U.S. PATENT DOCUMENTS

| | | |
|---|---|---|
| 7,390,716 B2 | 6/2008 | Lee |
| 7,518,198 B2 | 4/2009 | Suh |
| 8,012,820 B2 | 9/2011 | Majumdar et al. |
| 9,059,235 B2 | 6/2015 | Kondo et al. |
| 2002/0142552 A1 | 10/2002 | Wu |
| 2011/0193175 A1* | 8/2011 | Huang ............ H01L 21/823431 257/386 |
| 2015/0364601 A1 | 12/2015 | Kuang et al. |
| 2016/0064387 A1* | 3/2016 | Jeong .................. H01L 27/1104 257/401 |
| 2016/0163877 A1 | 6/2016 | Chung et al. |
| 2016/0276449 A1 | 9/2016 | Bae et al. |

* cited by examiner

SEMICONDUCTOR DEVICE WITH FIN-TYPE PATTERNS

CROSS-REFERENCE TO RELATED APPLICATIONS

This is a continuation application based on pending application Ser. No. 15/479,459, filed Apr. 5, 2017, the entire contents of which is hereby incorporated by reference.

Korean Patent Application No. 10-2016-0067531, filed on May 31, 2016, and entitled: "Semiconductor Device and Method for Fabricating the Same," is incorporated by reference herein in its entirety.

BACKGROUND

1. Field

One or more embodiments relate to a semiconductor device and a method for fabricating a semiconductor device.

2. Description of the Related Art

Efforts are continually being made to reduce the scale of semiconductor devices in order to achieve greater levels of integration, while at the same time increase operating speed. These efforts include reducing the size of transistors in the semiconductor device. This has lead to a reduction in the size of the transistor gates and their underlying channel regions.

SUMMARY

In accordance with one or more embodiments, a semiconductor device includes a field insulating film including a first region and a second region on a substrate; a recess in the first region of the field insulating film; a gate electrode on the second region of the field insulating film; and a gate spacer along a sidewall of the gate electrode and a sidewall of the recess.

In accordance with one or more other embodiments, a semiconductor device includes a first fin-type pattern and a second fin-type pattern adjacent to each other on a substrate; a field insulating film covering a portion of the first fin-type pattern and a portion of the second fin-type pattern and on the substrate between the first fin-type pattern and the second fin-type pattern; a first gate electrode and a second gate electrode on the field insulating film and intersecting the first fin-type pattern and the second fin-type pattern, the first gate electrode adjacent to the second gate electrode; a recess in the field insulating film between the first gate electrode and the second gate electrode; a liner on a sidewall of the recess and including a first portion and a second portion, the first portion of the liner on a sidewall of the first gate electrode and a sidewall of the second gate electrode and the second portion of the liner on a sidewall of the first fin-type pattern and a sidewall of the second fin-type pattern; a first epitaxial pattern on the first fin-type pattern between the first gate electrode and the second gate electrode; and a second epitaxial pattern on the second fin-type pattern between the first gate electrode and the second gate electrode.

In accordance with one or more other embodiments, a semiconductor device includes a first fin-type pattern adjacent to a second fin-type pattern on a substrate; a third fin-type pattern between the first fin-type pattern and the second fin-type pattern on the substrate, a distance between the third fin-type pattern and the first fin-type pattern greater than a distance between the third fin-type pattern and the second fin-type pattern; a field insulating film covering a portion of the first fin-type pattern, a portion of the second fin-type pattern, and a portion of the third fin-type pattern, on the substrate between the first fin-type pattern and the second fin-type pattern and between the second fin-type pattern and the third fin-type pattern; a gate electrode on the field insulating film and intersecting the first to third fin-type patterns; a first recess in the field insulating film between the first fin-type pattern and the third fin-type pattern; a second recess in the field insulating film between the second fin-type pattern and the third fin-type pattern; a gate spacer extending along a sidewall of the gate electrode, a sidewall of the first recess, and a sidewall of the second recess; a first epitaxial pattern on the first fin-type pattern; a second epitaxial pattern on the second fin-type pattern; and a third epitaxial pattern on the third fin-type pattern.

In accordance with one or more other embodiments, a method for fabricating a semiconductor device includes forming a fin-type pattern on a substrate; forming a field insulating film covering a portion of the fin-type pattern, on the substrate; forming a gate electrode intersecting the fin-type pattern on the field insulating film; forming a recess within the field insulating film by removing a portion of the field insulating film with the gate electrode as mask; forming a gate spacer along a sidewall of the gate electrode and a sidewall of the recess; forming an interlayer insulating film to surround a sidewall of the gate spacer and expose an upper surface of the gate electrode, on field insulating film; forming a trench within the interlayer insulating film by removing the gate electrode; and forming a replacement metal gate electrode filling the trench.

BRIEF DESCRIPTION OF THE DRAWINGS

Features will become apparent to those of skill in the art by describing in detail exemplary embodiments with reference to the attached drawings in which.

DETAILED DESCRIPTION

Some of the drawings illustrate a semiconductor device with one or more fin-type transistors (FinFETs) including a channel region in a fin-type pattern shape. Other embodiments may include different types of transistors, including but not limited to tunneling transistors (tunneling FETs), transistors including nanowires, transistors including nanosheets, and/or three-dimensional (3D) transistors. Other embodiments correspond to semiconductor devices that include a bipolar junction transistor, a laterally diffused metal oxide semiconductor transistor (LDMOS), and so on. Also, some embodiments of the semiconductor device include multi-channel transistors that use the fin-type pattern. Other embodiments correspond to semiconductor devices that have planar transistors.

Figure 1:
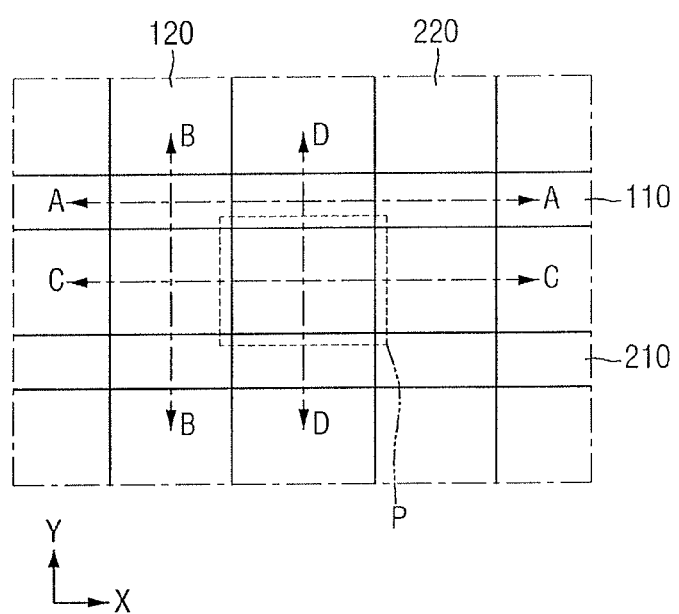
FIG. 1 illustrates an embodiment of a semiconductor device.
Figure 2A:
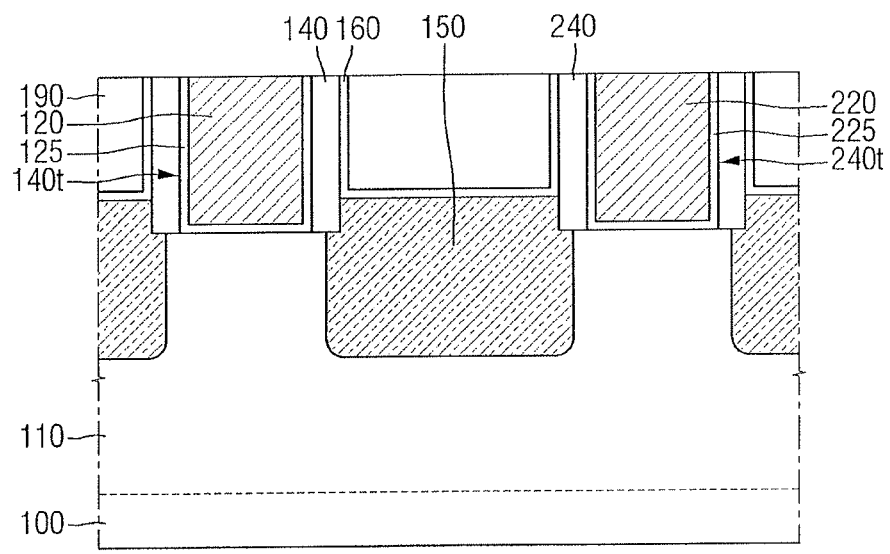
FIGS. 2A and 2B illustrate cross-sectional views of the semiconductor device.
Figure 2B:
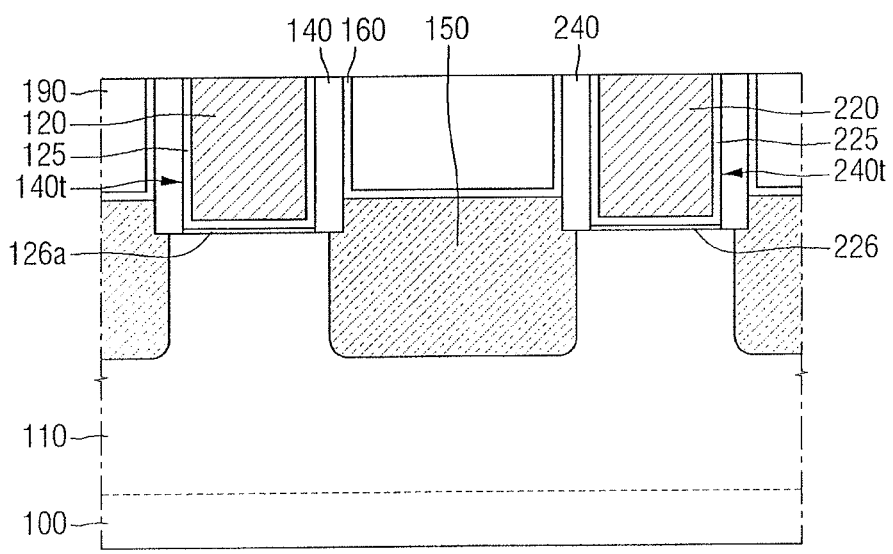
Figure 3A:
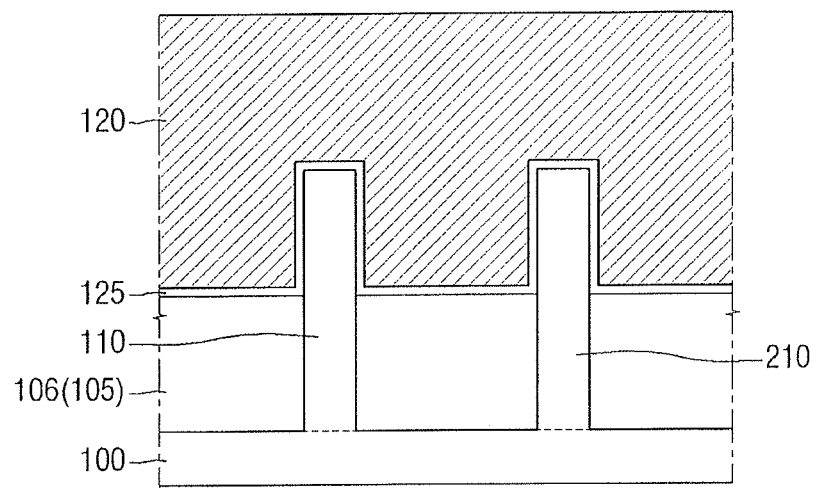
FIGS. 3A and 3B illustrate other cross-sectional views of the semiconductor device.
Figure 3B:
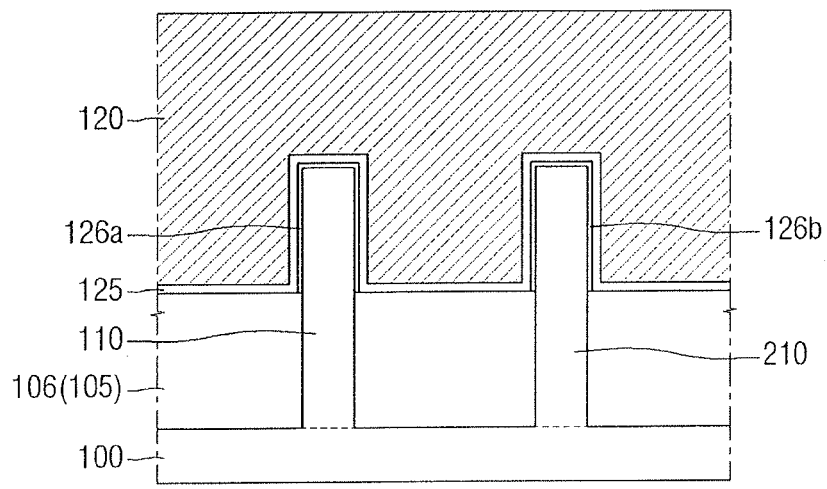
Figure 4:
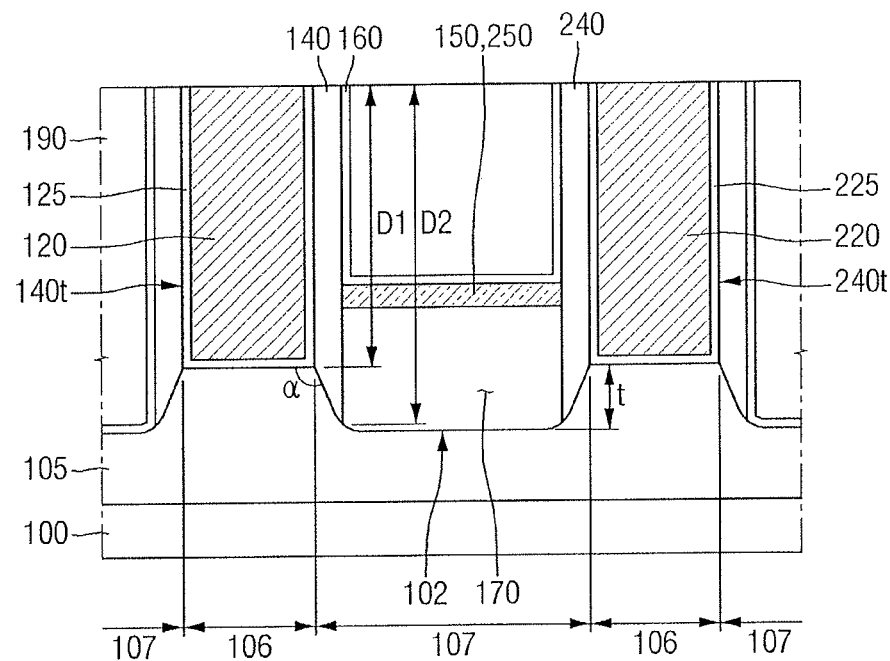
FIG. 4 illustrates other cross-sectional views of the semiconductor device.
Figure 5:
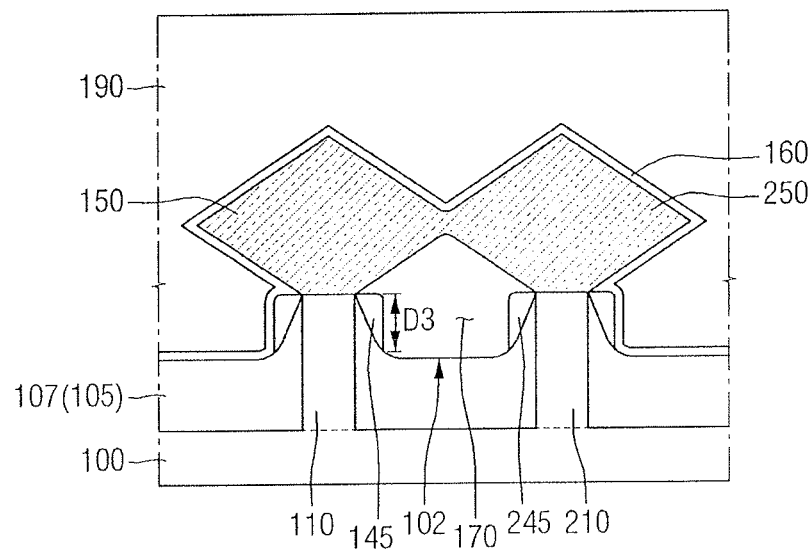
FIG. 5 illustrates other cross-sectional views of the semiconductor device.
Figure 6:
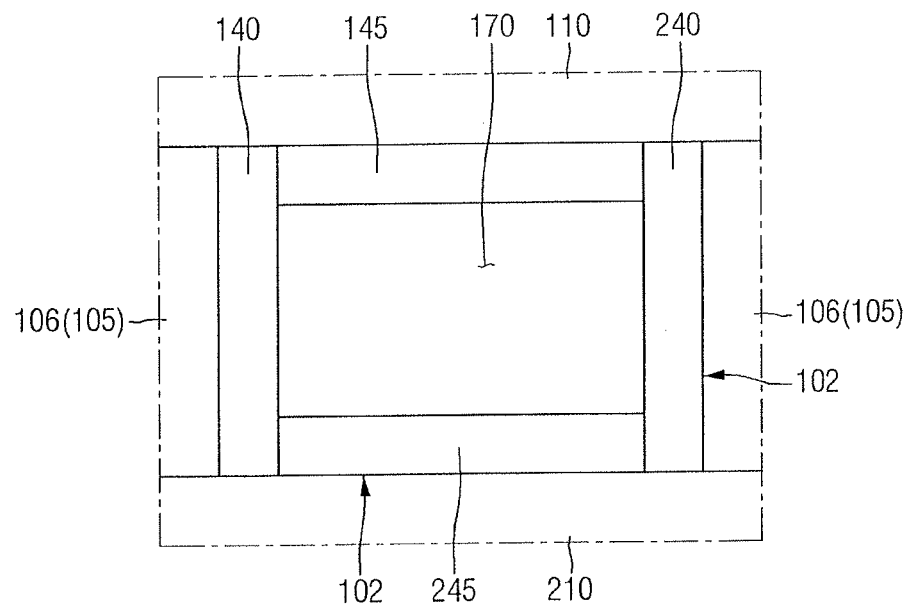
FIG. 6 illustrates an embodiment which includes a boundary line between a gate insulating film and a field insulating film.

FIG. 1 illustrates an embodiment of a semiconductor device. FIGS. 2A and 2B are cross-sectional views taken on line A-A of FIG. 1. FIGS. 3A and 3B are cross-sectional views taken on line B-B of FIG. 1. FIG. 4 is a cross-sectional view taken on line C-C of FIG. 1. FIG. 5 is a cross-sectional view taken on line D-D of FIG. 1. FIG. 6 illustrates an embodiment of a boundary line between a gate insulating film and a field insulating film of an encircled area P in FIG. 1.

Referring to FIGS. 1 to 6, the semiconductor device may include a substrate 100, a field insulating film 105, a first fin-type pattern 110, a second fin-type pattern 210, a first gate electrode 120, a second gate electrode 220, a first gate spacer 140, a second gate spacer 240, a first epitaxial pattern 150, and a second epitaxial pattern 250. The substrate 100 may be bulk silicon or a silicon-on-insulator (SOI). In one embodiment, the substrate 100 may be a silicon substrate or may include other materials such as but not limited to silicon germanium, silicon germanium on insulator (SGOI), indium antimonide, lead telluride, indium arsenide, indium phosphide, gallium arsenide, and/or gallium antimonide.

The first fin-type pattern 110 may extend longitudinally on the substrate 100 and in a first direction X. The first fin-type pattern 110 may protrude from the substrate 100. The second fin-type pattern 210 may extend longitudinally on the substrate 100 and in the first direction X. The second fin-type pattern 210 may protrude from the substrate 100.

The first fin-type pattern 110 and the second fin-type pattern 210 may be adjacent to each other. The first fin-type pattern 110 and the second fin-type pattern 210 may be parallel to each other. The first fin-type pattern 110 and the second fin-type pattern 210 may be arranged in a second direction Y. More specifically, each of the first fin-type pattern 110 and the second fin-type pattern 210 may include a long side extending in the first direction X and a short side extending in the second direction Y. The long side of the first fin-type pattern 110 and the long side of the second fin-type pattern 210 may face each other.

In one embodiment, the first fin-type pattern 110 and the second fin-type pattern 210 may be parts of the substrate 100 and, for example, may include the epitaxial layer grown from the substrate 100. The first fin-type pattern 110 and the second fin-type pattern 210 may include an element semiconductor material such as silicon or germanium. Further, the first fin-type pattern 110 and the second fin-type pattern 210 may include a compound semiconductor such as Group IV-IV compound semiconductor or Group III-V compound semiconductor.

In one embodiment including a Group IV-IV compound semiconductor, the first fin-type pattern 110 and the second fin-type pattern 210 may be a binary compound, a ternary compound including at least two or more of carbon (C), silicon (Si), germanium (Ge), tin (Sn), or a compound in which one of the above compounds is doped with a Group IV element.

In one embodiment including a Group III-V compound semiconductor, the first fin-type pattern 110 and the second fin-type pattern 210 may be one of a binary compound, a ternary compound, or a quaternary compound formed by a combination of a Group III element, which may be at least one of aluminum (Al), gallium (Ga), or indium (In), and a Group V element which may be one of phosphorus (P), arsenic (As) and antimony (Sb). According to some exemplary embodiments, the first fin-type pattern 110 and the second fin-type pattern 210 may be silicon fin-type patterns including silicon.

The first fin-type pattern 110 and the second fin-type pattern 210 may include the channel regions of the same type of transistors.

The field insulating film 105 may be on the substrate 100. The field insulating film 105 may be between the first fin-type pattern 110 and the second fin-type pattern 210. The field insulating film 105 may partially cover the first fin-type pattern 110 and the second fin-type pattern 210. The field insulating film 105 may partially cover a sidewall of the first fin-type pattern 110 and a sidewall of the second fin-type pattern 210.

Accordingly, an upper surface of the first fin-type pattern 110 and an upper surface of the second fin-type pattern 210 may protrude higher than an upper surface of the field insulating film 105 between the long side of the first fin-type pattern 110 and the long side of the second fin-type pattern 210. The first fin-type pattern 110 and the second fin-type pattern 210 may be defined by the field insulating film 105 on the substrate 100.

The field insulating film 105 may include a first region 106 and a second region 107. The first region 106 and the second region 107 of the field insulating film may be defined alternately. The first region 106 of the field insulating film may be a portion where the gate electrode is formed and the second region 107 of the field insulating film may be a portion between the adjacent gate electrodes.

A first recess 102 may be in the second region 107 of the field insulating film. The first recess 102 may be within the field insulating film 105. The first recess 102 may be formed by removing a portion of the field insulating film 105. The first region 106 of the field insulating film may be between the first recesses 102.

The depth (t) of the first recess 102 may be greater than or equal to 15 nm, for example. Further, the depth (t) of the first recess 102 may be less than or equal to 60 nm, for example. The depth (t) of the first recess 102 may be less than the thickness of the field insulating film 105. Accordingly, the second region 107 of the field insulating film may be between a bottom surface of the first recess 102 and the substrate 100. The depth (t) of the first recess 102 may be a distance from the upper surface of the first region 106 of the field insulating film to the bottom surface of the first recess 102.

An angle (α) between the sidewall of the first recess 102 and the upper surface of the first region 106 of the field insulating film at an uppermost portion of the first recess 102 may be greater than 0 degree and less than or equal to 120 degrees, for example. The angle (α) between the sidewall of the first recess 102 and the upper surface of the first region 106 of the field insulating film may be greater than 90 degrees and less than or equal to 120 degrees.

FIGS. 4 and 5 illustrate that the first recess 102 includes the sidewall and the bottom surface connecting the sidewall. In one embodiment t, the first recess 102 may include the sidewall at an angle with respect to the upper surface of the first region 106 of the field insulating film, and may not include the bottom surface parallel to the upper surface of the first region 106 of the field insulating film.

The field insulating film 105 may include at least one of silicon oxide, silicon nitride, silicon oxynitride, low-k dielectric material, or a combination of the above materials. For example, the low-k dielectric material may include flowable oxide (FOX), torene silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof.

Further, the field insulating film 105 may additionally include at least one field liner film between the first fin-type pattern 110 and the field insulating film 105 and between the second fin-type pattern 210 and the field insulating film 105. When the field insulating film 105 includes the field liner film, the field liner film may include at least one of polysilicon, amorphous silicon, silicon oxynitride, silicon nitride, or silicon oxide.

The first gate electrode 120 and the second gate electrode 220 may be respectively extending in the second direction Y. The first gate electrode 120 and the second gate electrode 220 may respectively intersect the first fin-type pattern 110 and the second fin-type pattern 210. The first gate electrode 120 and the second gate electrode 220 may be adjacent to each other.

The first gate electrode 120 and the second gate electrode 220 may be respectively formed on the first fin-type pattern 110, the field insulating film 105, and the second fin-type pattern 210. The first gate electrode 120 and the second gate electrode 220 may respectively surround the first fin-type pattern 110 and the second fin-type pattern 210, which protrude higher than the upper surface of the field insulating film 105.

The first gate electrode 120 and the second gate electrode 220 on the field insulating film 105 may be respectively formed on the first region 106 of the field insulating film. The first recess 102 formed within the second region 107 of the field insulating film may be between the first gate electrode 120 and the second gate electrode 220.

The first gate electrode 120 and the second gate electrode 220 may respectively include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or a combination thereof.

The first gate electrode 120 and the second gate electrode 220 may respectively include conductive metal oxide, conductive metal oxynitride, and oxidized form of the materials described above. For example, the first gate electrode 120 and the second gate electrode 220 may be formed by the replacement process (or gate last process).

The first gate spacer 140 may be formed on the sidewall of the first gate electrode 120. A portion of the first gate spacer 140 may be formed on the sidewall of the first recess 102. The first gate spacer 140 may extend along the sidewall of the first gate electrode 120 and the sidewall of the first recess 102. The first gate spacer 140 may be formed on the field insulating film 105. For example, the first gate spacer 140 may be formed on the second region 107 of the field insulating film. The bottom surface of the first gate spacer 140 may extend along the sidewall of the first recess 102.

The first gate spacer 140 may define a first trench 140t. The first trench 140t may be formed on the first region 106 of the field insulating film. The bottom surface of the first trench 140t may be defined, for example, by the upper surface of the first region 106 of the field insulating film.

The second gate spacer 240 may be formed on the sidewall of the second gate electrode 220. A portion of the second gate spacer 240 may be formed on the sidewall of the first recess 102. The second gate spacer 240 may extend along the sidewall of the second gate electrode 220 and the sidewall of the first recess 102.

A portion of the first gate spacer 140 and a portion of the second gate spacer 240 may be formed on the sidewalls of the first recess 102 which are facing each other.

The second gate spacer 240 may be formed on the field insulating film 105. For example, the second gate spacer 240 may be formed on the second region 107 of the field insulating film. The bottom surface of the second gate spacer 240 may extend along the sidewall of the first recess 102. The second gate spacer 240 may define the second trench 240t. The second trench 240t may be formed on the first region 106 of the field insulating film. The bottom surface of the second trench 240t may be defined by the upper surface of the first region 106 of the field insulating film, but not limited thereto.

The first gate spacer 140 may not be formed on at least a portion of the bottom surface of the first recess 102. The second gate spacer 240 may not be formed on at least a portion of the bottom surface of the first recess 102. The first gate spacer 140 and the second gate spacer 240 may be separate each other. For example, the first gate spacer 140 and the second gate spacer 240 may be separated from each other with the first recess 102 interposed therebetween. The first gate spacer 140 and the second gate spacer 240 may respectively include at least one of silicon nitride (SiN), silicon oxynitride (SiON), silicon oxide (SiO$_2$), silicon oxycarbonitride (SiOCN), or a combination thereof, for example.

As illustrated in FIG. 4, the distance from the upper surface of the first gate electrode 120 to the upper surface of the first region 106 of the field insulating film may be a first distance (D1). The distance from the upper surface of the first gate electrode 120 to the lowermost portion of the first gate spacer 140 may be a second distance (D2).

In the semiconductor device according to some exemplary embodiments, the distance (D2) from the upper surface of the first gate electrode 120 to the lowermost portion of the first gate spacer 140 may be greater than the distance (D1) from the upper surface of the first gate electrode 120 to the upper surface of the first region 106 of the field insulating film. For example, the distance from the substrate 100 to the upper surface of the first region 106 of the field insulating film may be greater than the distance from the substrate 100 to the lowermost portion of the first gate spacer 140.

The first gate insulating film 125 may be between the first fin-type pattern 110 and the first gate electrode 120 and between the second fin-type pattern 210 and the first gate electrode 120. The first gate insulating film 125 may be formed along a profile of the first fin-type pattern 110 and a profile of the second fin-type pattern that protrude higher than field insulating film 105.

The first gate insulating film 125 may be between the first gate electrode 120 and the field insulating film 105. Further, the first gate insulating film 125 may be between the first gate electrode 120 and the first region 106 of the field insulating film. The first gate insulating film 125 may be formed along the sidewall and the bottom surface of the first trench 140t. The first gate insulating film 125 may be between the first gate spacer 140 and the first gate electrode 120.

The second gate insulating film 225 may be between the first fin-type pattern 110 and the second gate electrode 220 and between the second fin-type pattern 210 and the second gate electrode 220. The second gate insulating film 225 may be formed along a profile of the first fin-type pattern 110 and a profile of the second fin-type pattern 210 which are protruding upward higher than the field insulating film 105.

The second gate insulating film 225 may be between the first gate electrode 120 and the field insulating film 105. The second gate insulating film 225 may be between the second gate electrode 220 and the first region 106 of the field insulating film. The second gate insulating film 225 may be along the sidewall and the bottom surface of the second trench 240t. The second gate insulating film 225 may be between the second gate spacer 240 and the second gate electrode 220.

As illustrated in FIGS. 2B and 3B, first interfacial layers 126a, 126b may be between the first gate insulating film 125 and the first fin-type pattern 110 and also between the first gate insulating film 125 and the second fin-type pattern 210. Further, the second interfacial layers 226 may be between the second gate insulating film 225 and the first fin-type pattern 110 and between the second gate insulating film 225 and the second fin-type pattern 210.

When the first fin-type pattern 110 and the second fin-type pattern 210 are silicon fin-type patterns, the first interfacial layers 126a, 126b and the second interfacial layers 226 may respectively include a silicon oxide.

In FIGS. 2B and 3B, the first interfacial layers 126a, 126b and the second interfacial layers 226 are formed along the profile of the first fin-type pattern 110 and the profile of the second fin-type pattern 210 which, for example, protrude higher than the upper surface of the field insulating film 105.

The first interfacial layers 126a, 126b and the second interfacial layers 226 may extend along the upper surface of the first region 106 in the field insulating film according to a method for forming the first interfacial layers 126a, 126b and the second interfacial layers 226.

The first gate insulating film 125 and the second gate insulating film 225 may include a high-k dielectric material having a higher dielectric constant than a silicon oxide film. For example, the first gate insulating film 125 and the second gate insulating film 225 may include at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

While the oxides are mainly described with respect to the first gate insulating film 125 and the second gate insulating film 225 described above, in one embodiment the first gate insulating film 125 and second gate insulating film 225 may include at least one of the nitride (e.g., hafnium nitride) or the oxynitride (e.g., hafnium oxynitride) of the metal materials described above.

As illustrated in FIG. 4, the first gate insulating film 125, the second gate insulating film 225, the first gate electrode 120, and the second gate electrode 220 may be formed on the first region 106 of the field insulating film. The bottom surface of the first gate spacer 140 and the bottom surface of the second gate spacer 240 may be formed on the second region 107 of the field insulating film.

A first fin spacer 145 may be formed on the sidewall of first fin-type pattern 110 between the first gate electrode 120 and the second gate electrode 220. The first fin spacer 145 may be formed on the sidewall of the first recess 102. The first fin spacer 145 may be formed on the field insulating film 105. Because the first fin spacer 145 is formed between the first gate electrode 120 and the second gate electrode 220, the first fin spacer 145 may be formed on the second region 107 of the field insulating film.

The second fin spacer 245 may be formed on the sidewall of the second fin-type pattern 210 between the first gate electrode 120 and the second gate electrode 220. The second fin spacer 245 may be formed on the sidewall of the first recess 102.

The first fin spacer 145 and the second fin spacer 245 may be formed on the sidewall of the first recess 102 facing each other. The second fin spacer 245 may be formed on the field insulating film 105. Since the second fin spacer 245 is between the first gate electrode 120 and the second gate electrode 220, the second fin spacer 245 may be formed on the second region 107 of the field insulating film.

The first fin spacer 145 may not be formed on at least a portion of the bottom surface of the first recess 102. The second fin spacer 245 may not be formed on at least a portion of the bottom surface of the first recess 102. The first fin spacer 145 and the second fin spacer 245 may be separate each other.

The first fin spacer 145 and the second fin spacer 245 may respectively include, for example, at least one of silicon nitride (SiN), silicon oxynitride (SiON), silicon oxide (SiO$_2$), silicon oxycarbonitride (SiOCN), or a combination thereof. The first fin spacer 145 and the second fin spacer 245 may include the same materials as the first gate spacer 140 and the second gate spacer 240.

As illustrated in FIG. 5, the distance from the upper surface of the substrate 100 to the upper surface of the first fin spacer 145 may be equal to, for example, the distance from the upper surface of the substrate 100 to the upper surface of the first fin-type pattern 110. The distance from the upper surface of the substrate 100 to the upper surface of the second fin spacer 245 may be equal to, for example, the distance from the upper surface of the substrate 100 to the upper surface of the second fin-type pattern 210.

In FIG. 6, the first fin spacer 145 may be in contact with the first gate spacer 140 and the second gate spacer 240, and the second fin spacer 245 may be in contact with the first gate spacer 140 and the second gate spacer 240. The first gate spacer 140 and the second gate spacer 240 may be connected to each other through mediation of the first fin spacer 145 and the second fin spacer 245. For example, the first fin spacer 145 and the second fin spacer 245 may be connected to each other through mediation of the first gate spacer 140 and the second gate spacer 240.

The first recess 102 may be between the first gate electrode 120 and the second gate electrode 220 and within the field insulating film 105 between the first fin-type pattern 110 and the second fin-type pattern 210.

A portion of the first gate spacer 140, a portion of the second gate spacer 240, the first fin spacer 145 and the second fin spacer 245 may be formed along the perimeter of the sidewall of the first recess 102. For example, blocking liners 140, 145, 240, 245 may be formed on the sidewall of the first recess 102. The blocking liners may include a first portion and a second portion. The first portion 140, 240 of the blocking liners may extend along the sidewalls of the first gate electrode 120 and the second gate electrode 220. The second portion 145, 245 of the blocking liners may be formed on the sidewalls of the first fin-type pattern 110 and the second fin-type pattern 210.

The first portion of the blocking liners may include the first gate spacer 140 extending along the sidewall of the first gate electrode 120 and the sidewall of the first recess 102 and the second gate spacer 240 extending along the sidewall of the second gate electrode 220 and the sidewall of the first recess 102. The second portion of the blocking liners may include the first fin spacer 145 on the sidewall of the first fin-type pattern 110 and the second fin spacer 245 on the sidewall of the second fin-type pattern 210.

The blocking liners 140, 145, 240, 245 may be formed along the outer circumference of the first recess 102, but may not be formed at the center of the first recess 102. Thus, the first gate spacer 140 and the second gate spacer 240 may be displaced from each other, and the first fin spacer 145 and the second fin spacer 245 may be displaced from each other. A first air gap 170 may be positioned within the first recess 102 in which the blocking liners 140, 145, 240, 245 are formed.

In FIGS. 4 and 5, the height (D1) of the first gate spacer 140 may be greater than the height (D3) of the first fin spacer 145. When the lowermost portion of the first gate spacer 140 and the lowermost portion of the first fin spacer 145 are at the same height, the upper surface of the first gate spacer 140 may be higher than the upper surface of the first fin spacer 145 based on the bottom surface of the first recess 102.

FIG. 5 illustrates that the second region 107 of the field insulating film is between the first fin-type pattern 110 and the first fin spacer 145 and between the second fin-type pattern 210 and the second fin spacer 245. However, this the second region 107 may be at a different location in another embodiment.

Further, as illustrated in FIG. 5, the distance from the upper surface of the substrate 100 to the uppermost portion of the second region 107 of the field insulating film may be equal to, for example, the distance from the upper surface of the substrate 100 to the upper surface of the first fin-type pattern 110. The distance from the upper surface of the substrate 100 to the uppermost portion of the second region 107 of the field insulating film may be equal to, for example, the distance from the upper surface of the substrate 100 to the upper surface of the second fin-type pattern 210.

A first epitaxial pattern 150 may be between the first gate electrode 120 and the second gate electrode 220. The first epitaxial pattern 150 may be formed on the first fin-type pattern 110. The first epitaxial pattern 150 may be included within the source/drain of a transistor which uses the first fin-type pattern 110 as channel region. The second epitaxial pattern 250 may be between the first gate electrode 120 and the second gate electrode 220. The second epitaxial pattern 250 may be formed on the second fin-type pattern 210. The second epitaxial pattern 250 may be included within the source/drain of the transistor which uses the second fin-type pattern 210 as channel region. The first epitaxial pattern 150 and the second epitaxial pattern 250 may be respectively semiconductor patterns.

When the first fin-type pattern 110 and the second fin-type pattern 210 include the channel region of PMOS transistor, the first epitaxial pattern 150 and the second epitaxial pattern 250 may include compressive stress materials. For example, the compressive stress material may be a material such as SiGe, which has a greater lattice constant than Si. The compressive stress material may enhance the mobility of the carrier in the channel region by exerting the compressive stress on the first fin-type pattern 110 and the second fin-type pattern 210.

Differently from the above, when the first fin-type pattern 110 and the second fin-type pattern 210 respectively include the channel region of NMOS transistor, the first epitaxial pattern 150 and the second epitaxial pattern 250 may include the tensile stress materials. For example, when the first fin-type pattern 110 and the second fin-type pattern 210 are Si, the first epitaxial pattern 150 and the second epitaxial pattern 250 may be a material such as SiC, which has a smaller lattice constant than Si. For example, the tensile stress material may enhance the mobility of the carrier in the channel region by exerting the tensile stress on the first fin-type pattern 110 and the second fin-type pattern 210. Further, when the first fin-type pattern 110 and the second fin-type pattern 210 are Si, the first epitaxial pattern 150 and the second epitaxial pattern 250 may be respectively silicon epitaxial patterns.

In the semiconductor device according to some exemplary embodiments, the first epitaxial pattern 150 and the second epitaxial pattern 250 may be in contact with each other. The first epitaxial pattern 150 and the second epitaxial pattern 250 (which are in contact with each other) may be disposed in a line along one sidewall of the first gate electrode 120.

The first epitaxial pattern 150 and the second epitaxial pattern 250 may correspond to a merged source/drain of the transistor including the first gate electrode 120 or the second gate electrode 220.

The first air gap 170 may be between the first epitaxial pattern 150 and the second epitaxial pattern 250, and the field insulating film 105. The first air gap 170 may be on the second region 107 of the field insulating film. The first air gap 170 may be surrounded by the first epitaxial pattern 150, the second epitaxial pattern 250, the first gate spacer 140, the second gate spacer 240, the first fin spacer 145, the second fin spacer 245 and the field insulating film 105. In other words, the blocking liners 140, 145, 240, 245 on the sidewall of the first recess 102, the field insulating film 105, the first epitaxial pattern 150 and the second epitaxial pattern 250 may surround the first air gap 170.

Since the first air gap 170 can be defined within the first recess 102, the semiconductor pattern may not be formed within the first recess 102. A portion of the first air gap 170 may be defined at a lower portion than the upper surface of the first region 106 of the field insulating film.

Because the first epitaxial pattern 150 and the second epitaxial pattern 250 are in contact with each other, the semiconductor pattern including the first epitaxial pattern 150 and/or the second epitaxial pattern 250 may be on the second region 107 of the field insulating film between the first fin-type pattern 110 and the second first fin-type pattern 210.

Further, because the first epitaxial pattern 150 and the second epitaxial pattern 250 are in contact with each other, the first air gap 170 may be between the semiconductor pattern and the field insulating film 105. The first air gap 170 may be on the field insulating film 105. The semiconductor pattern including the first epitaxial pattern 150 and/or the second epitaxial pattern 250 may be on the first air gap 170.

As illustrated in FIGS. 4 and 5, because the first epitaxial pattern 150 and the second epitaxial pattern 250 are in contact at a higher portion than the uppermost portion of the first recess 102, the distance from the upper surface of the first gate electrode 120 to the bottom surface of the semiconductor pattern including the first epitaxial pattern 150 and/or the second epitaxial pattern 250 may be less than the distance from the upper surface of the first gate electrode 120 to the upper surface of the first region 106 of the field insulating film.

The bottom surface of the semiconductor pattern including the first epitaxial pattern 150 and/or the second epitaxial pattern 250 may be farther from the substrate 100 than the upper surface of the first region 106 of the field insulating film.

The etch-stop film 160 may be formed on the first epitaxial pattern 150 and the second epitaxial pattern 250. The etch-stop film 160 may extend along a portion of the profile of the first epitaxial pattern 150 and a portion of the profile of the second epitaxial pattern 250, the outer sidewall of the first gate spacer 140, and the outer sidewall of the second gate spacer 240.

By forming the first air gap 170 between the first epitaxial pattern 150 and the second epitaxial pattern 250, and the field insulating film 105, the etch-stop film 160 may not be formed on the sidewall and the bottom surface of the first recess 102 in which the first air gap 170 is defined. The etch-stop film 160 may be insulating pattern. For example, the etch-stop film 160 may include at least one of, for example, silicon nitride, silicon oxynitride, silicon oxycarbonitride (SiOCN), silicon oxide, silicon carbonitride (SiCN), or a combination thereof. Further, the etch-stop film 160 may be a single film or multiple films.

In FIG. 4, the etch-stop film 160 on the semiconductor pattern including the first epitaxial pattern 150 and/or the second epitaxial pattern 250 may protrude from the first gate spacer 140 and the second gate spacer 240. The etch-stop film 160 may include a portion substantially parallel to the upper surface of the first region 106 of the field insulating film. Further, the etch-stop film 160 on the semiconductor pattern including the first epitaxial pattern 150 and/or the second epitaxial pattern 250 may include a portion formed along a portion of the outer sidewall of the first gate spacer 140 and a portion of the outer sidewall of the second gate spacer 240.

An interlayer insulating film 190 may be on the etch-stop film 160. The interlayer insulating film 190 may surround the first epitaxial pattern 150, the second epitaxial pattern 250, the sidewall of the first gate electrode 120, and the sidewall of the second gate electrode 220. The interlayer insulating film 190 may surround the outer sidewall of the first gate spacer 140 and the outer sidewall of the second gate spacer 240.

In the semiconductor device according to some exemplary embodiments, the upper surface of the first gate electrode 120 and the second gate electrode 220 may be on the same plane as the upper surface of the interlayer insulating film 190. For example, the interlayer insulating film 190 may include, for example, silicon oxide, silicon nitride, silicon oxynitride, flowable oxide (FOX), tonene silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

FIGS. 1 to 6 illustrate a plurality of the fin-type patterns and a plurality of the gate electrodes intersecting a plurality of the fin-type patterns. Another embodiment may include a single fin-type pattern and a single gate electrode intersecting the single fin-type pattern. Some embodiments may include a single fin-type pattern and a plurality of the gate electrodes intersecting the single fin-type pattern, or a plurality of the fin-type patterns and a single gate electrode intersecting a plurality of the fin-type patterns.

Figure 7:
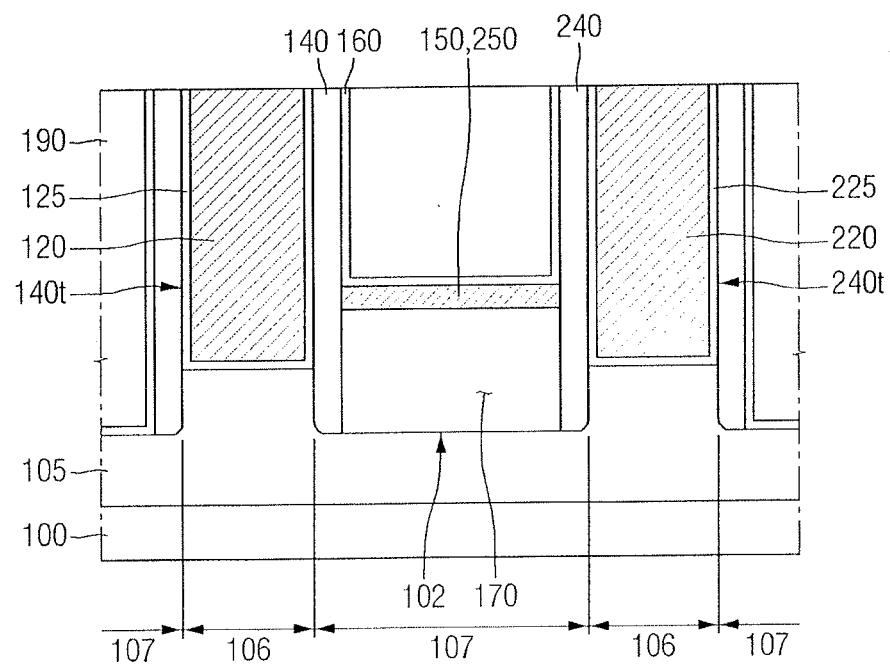
FIG. 7 illustrates another embodiment of a semiconductor device.
Figure 8:
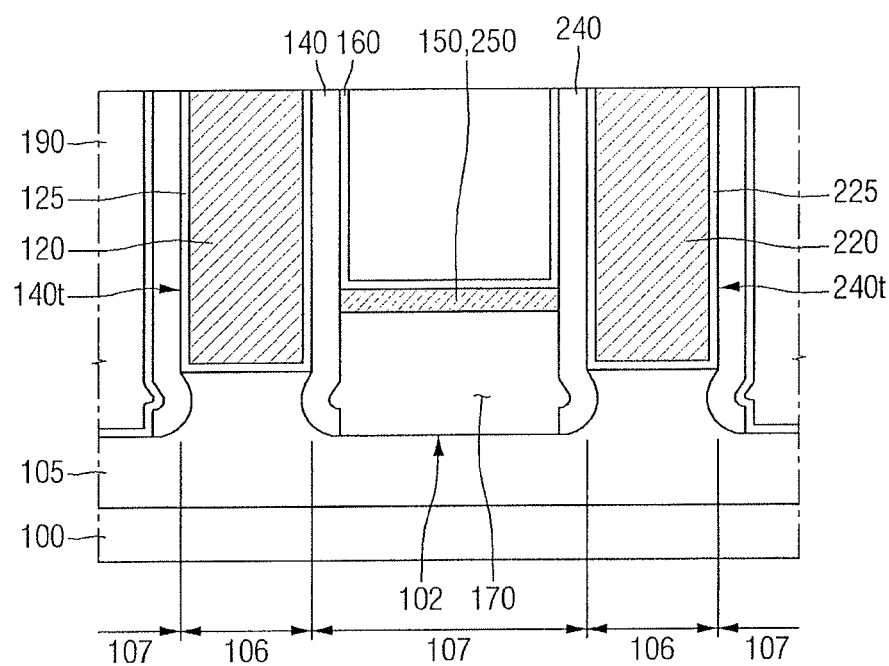
FIG. 8 illustrates another embodiment of a semiconductor device.

FIGS. 7 and 8 illustrate other embodiments of a semiconductor device. For reference, FIGS. 7 and 8 are cross sectional views taken on line C-C of FIG. 1.

Referring to FIG. 7, an angle between the sidewall of the first recess 102 and the upper surface of the first region 106 of the field insulating film on the uppermost portion of the first recess 102 may be 90 degrees. The first gate insulating film 125 extending along the sidewall of the first trench 140t and the sidewall of the first recess 102 may be disposed in a line or in another arrangement.

Referring to FIG. 8, an angle between the sidewall of the first recess 102 and the upper surface of the first region 106 in the field insulating film on the uppermost portion of the first recess 102 may be less than 90 degrees and greater than 0 degrees. The width of the first recess 102 between the first gate electrode 120 and the second gate electrode 220 may increase and decrease as the distance from the upper surface of the first region 106 of the field insulating film increases.

Although FIG. 8 illustrates that a portion of the outer sidewall of the first gate spacer 140 and a portion of the outer sidewall of the second gate spacer 240 are formed along the profile of the sidewall of the first recess 102. In another embodiment, these features may be formed along a different profile. Also, these features may be modified according to the depth of the first gate spacer 140 and the second gate spacer 240 and the etch process for forming the first gate spacer 140 and the second gate spacer 240.

Figure 9:
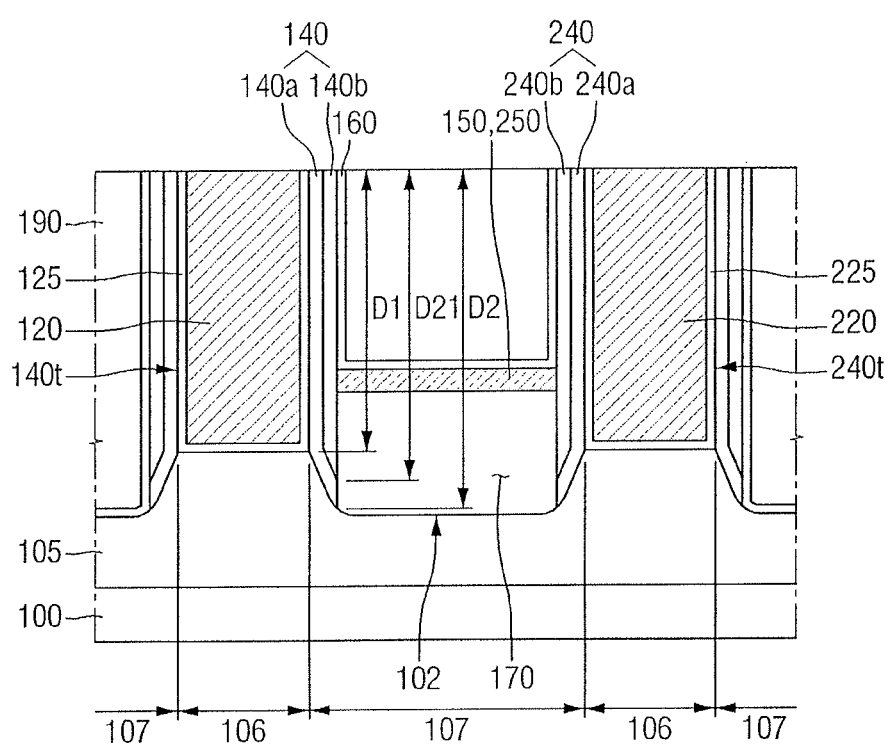
FIG. 9 illustrates another embodiment of a semiconductor device.

FIG. 9 illustrates another embodiment of semiconductor device. For reference, FIG. 9 is a cross sectional view taken on line C-C of FIG. 1. Referring to FIG. 9, the first gate spacer 140 may include a first inner gate spacer 140a and a first outer gate spacer 140b, and the second gate spacer 240 may include a second inner gate spacer 240a and a second outer gate spacer 240b. The first inner gate spacer 140a may be formed on the sidewall of the first gate electrode 120. The first outer gate spacer 140b may be formed on the first inner gate spacer 140a. The first inner gate spacer 140a and the first outer gate spacer 140b may be sequentially formed on the sidewall of the first gate electrode 120.

The second inner gate spacer 240a may be formed on the sidewall of the second electrode gate 220. The second outer gate spacer 240b may be on the second inner gate spacer 240a. The second inner gate spacer 240a and the second outer gate spacer 240b may be sequentially formed on the sidewall of the second gate electrode 220.

The first inner gate spacer 140a and the second inner gate spacer 240a may respectively include a vertical portion extended along the sidewall of the first gate electrode 120 and the sidewall of the second gate electrode 220, and a lateral portion extending along the sidewall of the first recess 102. For example, the first inner gate spacer 140a and the second inner gate spacer 240a may have the L-shaped form.

As illustrated in FIG. 9, the lateral portion of the first inner gate spacer 140a and the second inner gate spacer 240a may have an obtuse angle with respect to the vertical portion of the first inner gate spacer 140a and the second inner gate spacer 240a. In one embodiment, the first inner gate spacer 140a and the second inner gate spacer 240a may have the L-shaped form. Also, the first outer gate spacer 140b and the second outer gate spacer 240b may have an L-shaped form.

In FIG. 9, the first outer gate spacer 140b and the second outer gate spacer 240b may respectively include a portion with a decreasing width on the sidewall of the first recess 102. In one embodiment, the first outer gate spacer 140b and the second outer gate spacer 240b may have an I-shaped form.

The distance from the upper surface of the first gate electrode 120 to the upper surface of the first region 106 of the field insulating film may be first distance (D1), the distance from the upper surface of the first gate electrode 120 to the lowermost portion of the first inner gate spacer 140a may be second distance (D2), and the distance from the upper surface of the first gate electrode 120 to the lowermost portion of the first outer gate spacer 140b may be third distance (D21). The distance (D2) from the upper surface of the first gate electrode 120 to the lowermost portion of the first inner gate spacer 140a may be equal to, for example, the distance from the upper surface of the first gate electrode 120 to the lowermost portion of the first gate spacer 140.

In the semiconductor device according to some exemplary embodiments, the distance (D21) from the upper surface of the first gate electrode 120 to the lowermost portion of the first outer gate spacer 140b may be greater than the distance (D1) from the upper surface of the first gate electrode 120 to the upper surface of the first region 106 of the field insulating film. The distance (D2) from the upper surface of the first gate electrode 120 to the lowermost portion of the first inner gate spacer 140a may be greater than the distance (D1) from the upper surface of the first gate electrode 120 to the upper surface of the first region 106 of the field insulating film.

As illustrated in FIG. 9, the first inner gate spacer 140a and the second inner gate spacer 240a are single layers, respectively. In one embodiment, at least one of the first inner gate spacer 140a or the second inner gate spacer 240a may be a multilayer. The first inner gate spacer 140a, the first outer gate spacer 140b, the second inner gate spacer 240a, and second outer gate spacer 240b may respectively include, for example, at least one of silicon nitride (SiN), silicon oxynitride (SiON), silicon oxide ($SiO_2$), silicon oxycarbonitride (SiOCN), or a combination thereof.

The first inner gate spacer 140a and the first outer gate spacer 140b may include the different materials from each other or the same material. The second inner gate spacer 240a and the second outer gate spacer 240b may include the different materials from each other or the same material.

When the first inner gate spacer 140a, the first outer gate spacer 140b, the second inner gate spacer 240a, and the second outer gate spacer 240b respectively include the same material (e.g., SiOCN), the first oxygen concentration (or fraction) in the first inner gate spacer 140a and the second inner gate spacer 240a may be different from the oxygen concentration (or fraction) in the first outer gate spacer 140b and the second outer gate spacer 240b. For example, the oxygen concentration (or fraction) in the first inner gate spacer 140a and the second inner gate spacer 240a may be greater than the oxygen concentration (or fraction) in the first outer gate spacer 140b and the second outer gate spacer 240b.

While the oxygen concentration increases in SiOCN, the etching resistance of SiOCN to the etchant to etch the oxide may decrease. For example, the first gate spacer 140 and the second gate spacer 240 may be frequently exposed to the etchant to etch the oxide before the first gate electrode 120 and the second gate electrode 220 are formed through the replacement metal gate process. When the first gate spacer 140 and the second gate spacer 240 are frequently exposed to the etchant to etch the oxide, the first gate spacer 140 and the second gate spacer 240 may be etched out of the intention of a manufacturer of the semiconductor device.

Thus, the first gate spacer 140 and the second gate spacer 240 may be prevented from being over-etched by making the oxygen concentration (or fraction) in the first outer gate spacer 140b to be less than the oxygen concentration (or fraction) in the first inner gate spacer 140a.

When the first inner gate spacer 140a and the second inner gate spacer 240a are exposed to the etchant to etch the oxide before the first gate electrode 120 and the second gate electrode 220 are formed, the first inner gate spacer 140a and the second inner gate spacer 240a may be etched with the etchant to etch the oxide.

When the first inner gate spacer 140a and the second inner gate spacer 240a are partly etched and when the etchant to etch the oxide is used in the replacement metal gate process, a pin hole penetrating the first gate spacer 140 and the second gate spacer 240 may be formed.

At least portion of the first epitaxial pattern 150 and/or the second epitaxial pattern 250 may be removed with the silicon etchant introduced into the first air gap 170 through the pin hole penetrating the first gate spacer 140 and the second gate spacer 240.

However, the distance from the bottom surface of the first trench 140t in which the first gate electrode 120 is formed to the lowermost portion of the first inner gate spacer 140a exposed by the first air gap 170 may be increased by extending a portion of the first gate spacer 140 along the sidewall of the first recess 102 formed within the second region 107 of the field insulating film.

Because the length of the first inner gate spacer 140a between the first air gap 170 to the bottom surface of the first trench 140t may increase, the pin hole penetrating the first gate spacer 140 is not formed even when the first inner gate spacer 140a is exposed to the etchant to etch the oxide before and after the replacement metal gate process.

Thus, introduction of the silicon etchant into the first air gap 170 during the replacement metal gate forming process may be prevented. Because the first epitaxial pattern 150 and/or the second epitaxial pattern 250 are not damaged by the silicon etchant, the performance and the reliability of the semiconductor device may be enhanced.

Figure 10:
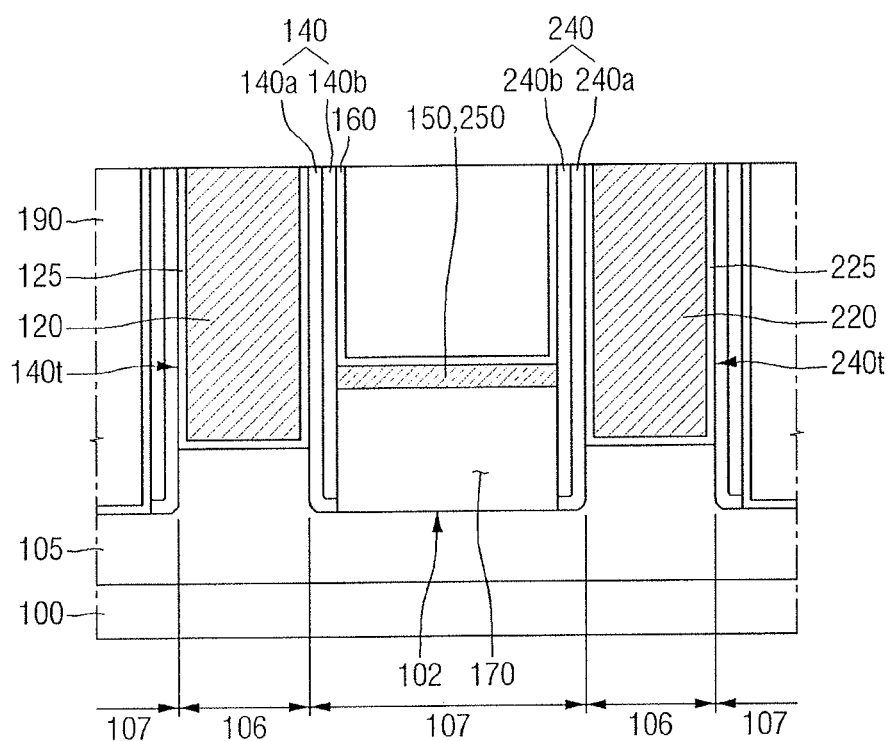
FIG. 10 illustrates another embodiment of a semiconductor device.
Figure 11:
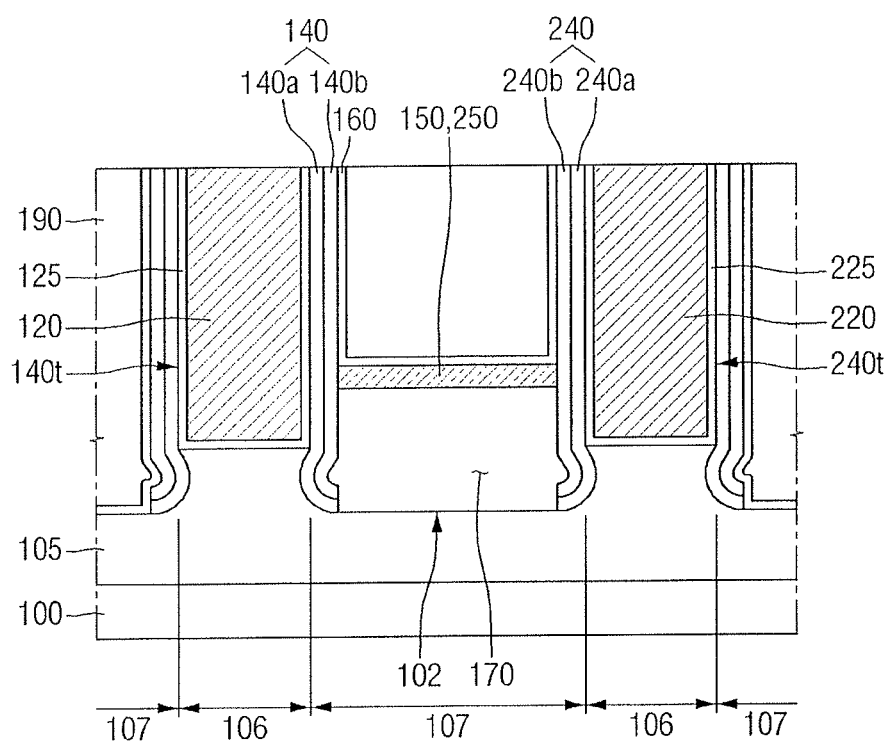
FIG. 11 illustrates another embodiment of a semiconductor device.
Figure 12:
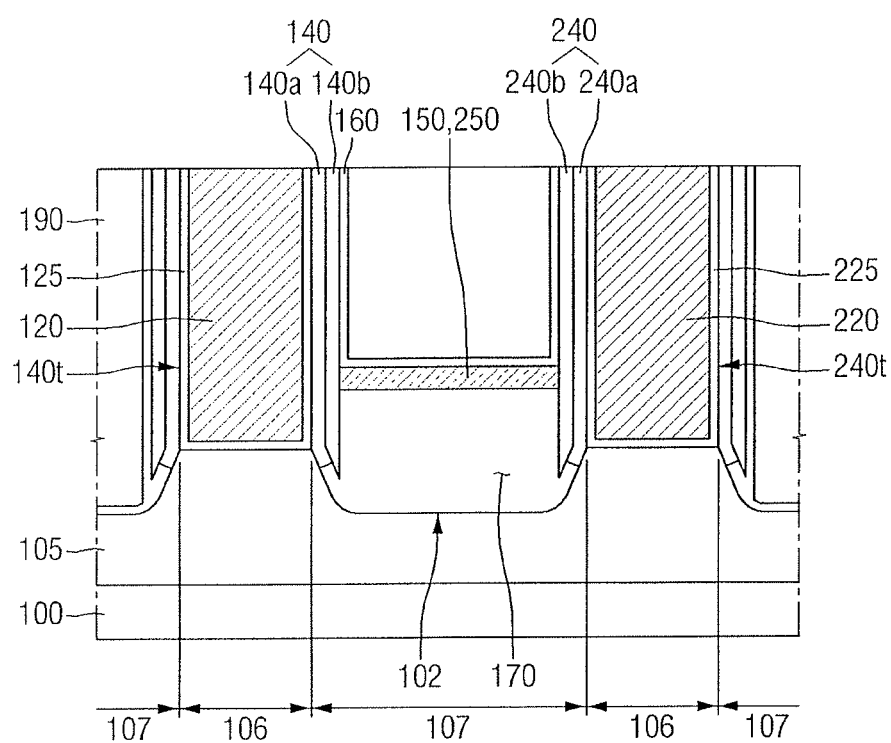
FIG. 12 illustrates another embodiment of a semiconductor device.

FIGS. 10-12 illustrates other embodiments of a semiconductor device.

Referring to FIG. 10, the first inner gate spacer 140a may extend along the sidewall of the first recess 102 which is at 90 degrees with respect to the upper surface of the first region in the field insulating film. The angle between the sidewall of the first recess 102 and upper surface of the first region 106 of the field insulating film may be 90 degrees on the uppermost portion of the first recess 102. The first gate insulating film 125 extending along the sidewall of the first trench 140t and the sidewall of the first recess 102 may be disposed in a line or another arrangement.

Referring to FIG. 11, an angle between the sidewall of the first recess 102 and the upper surface of the first region 106 in the field insulating film on the uppermost portion of the first recess 102 may be lesser than 90 degrees and greater than 0 degree. The first inner gate spacer 140a may extend along the sidewall of the first gate electrode 120 and the sidewall of the first recess 102. The second inner gate spacer 240a may extend along the sidewall of the first gate electrode 120 and the sidewall of the first recess 102.

In FIG. 11, a portion of the outer sidewall of the first outer gate spacer 140b and a portion of the outer sidewall of the second outer gate spacer 240b are formed along the profile of the sidewall of the first recess 102. In another embodiment, a portion of the outer sidewall of the first outer gate spacer 140b and a portion of the outer sidewall of the second outer gate spacer 240b may be formed along another profile. The outer sidewall of the first outer gate spacer 140b and the outer sidewall of the second outer gate spacer 240b respectively may not include the portion extended along the profile of the sidewall of the first recess 102.

Referring to FIG. 12, a portion of the first inner gate spacer 140a and a portion of the second inner gate spacer 240a may be etched. A portion of the first air gap 170 may extend between the sidewall of the first recess 102 and the first outer gate spacer 140b upon removal of a portion of the first inner gate spacer 140a between the sidewall of the first recess 102 and the first outer gate spacer 140b.

Figure 13:
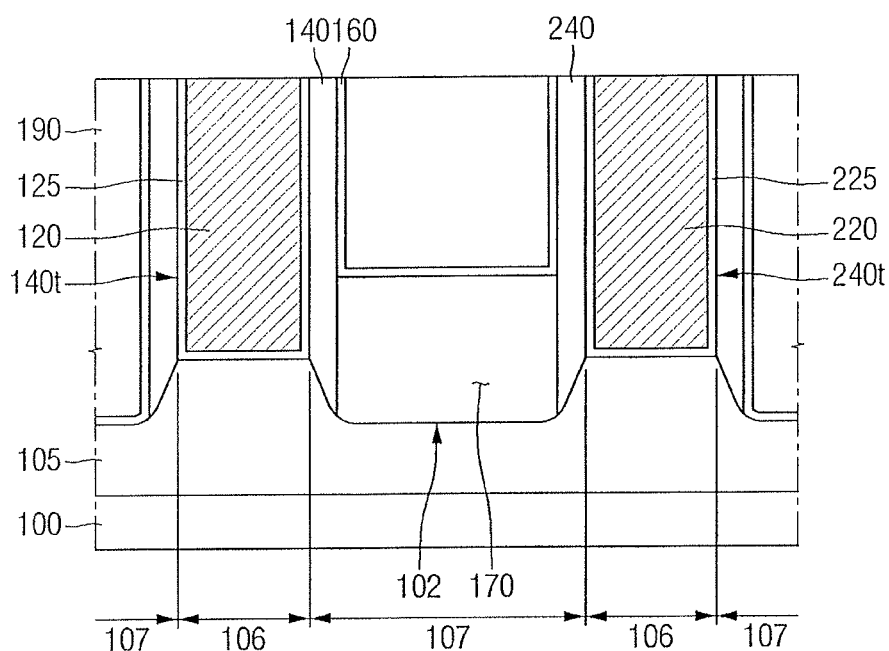
FIGS. 13 and 14 illustrate another embodiment of a semiconductor device.
Figure 14:
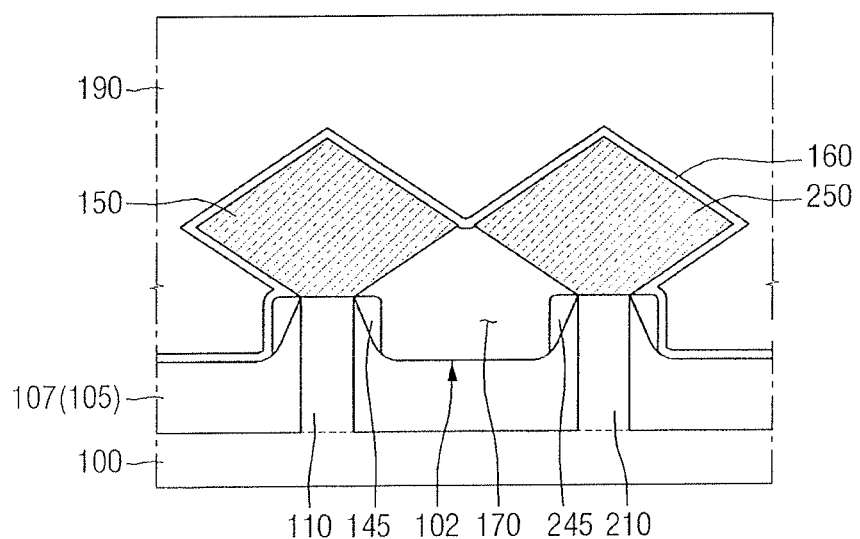

FIGS. 13 and 14 illustrate other embodiments of a semiconductor device. For reference, FIG. 13 is a cross sectional view taken on line C-C of FIG. 1 and FIG. 14 is a cross sectional view taken on line D-D of FIG. 1.

Referring to FIGS. 13 and 14, the first epitaxial pattern 150 and the second epitaxial pattern 250, which are arranged in a line along one sidewall of the first gate electrode 120, may not be in contact with each other. However, the first air gap 170 may be between the first epitaxial pattern 150 and the second epitaxial pattern 250, and the field insulating film 105. Even though the first epitaxial pattern 150 and the second epitaxial pattern 250 are not in contact with each other, the first air gap 170 may be formed on the second region 107 of the field insulating film by the etch-stop film 160. Also, even though the first epitaxial pattern 150 and the second epitaxial pattern 250 are not in contact with each other, the two patterns 150, 250 may be closely arranged. Thus, etch-stop film 160 may fill the shortest displacement region between the first epitaxial pattern 150 and the second epitaxial pattern 250. The first air gap 170 may be formed, for example, with the above process.

The first air gap 170 may be surrounded by the first epitaxial pattern 150, the second epitaxial pattern 250, the etch-stop film 160, the first gate spacer 140, the second gate spacer 240, the first fin spacer 145, the second fin spacer 245 and the field insulating film 105. Thus, the blocking liners 140, 145, 240, 245 on the sidewall of the first recess 102, the field insulating film 105, the etch-stop film 160, the first epitaxial pattern 150 and the second epitaxial pattern 250 may surround the first air gap 170.

FIG. 13 illustrates that the semiconductor pattern including the first epitaxial pattern 150 and/or the second epitaxial pattern 250 is not between the etch-stop film 160 and the first air gap 170. Depending on which portion between the first fin-type pattern and the second fin-type pattern is sectioned, there may be a sectioned region in which the semiconductor pattern including the first epitaxial pattern 150 and the second epitaxial pattern 250 is arranged between the etch-stop film 160 and the first air gap 170.

Further, FIG. 14 illustrates that the etch-stop film 160 is not formed on the sidewall of the first epitaxial pattern 150 nor on the sidewall of the second epitaxial pattern 250 defining the first air gap 170. The etch-stop film 160 may be formed in a different manner in another embodiment.

In one embodiment, a portion of the etch-stop film 160 may be deposited on the sidewall of the first epitaxial pattern 150 and the sidewall of the second epitaxial pattern 250 which define the first air gap 170 before completely filling the shortest displacement region between the first epitaxial pattern 150 and the second epitaxial pattern 250.

In the semiconductor device explained with reference to FIGS. 13 to 14, the first fin-type pattern 110 and the second fin-type pattern 210 may include the channel regions of the same type of the transistors or the channel regions of the different types of the transistors.

Figure 15:
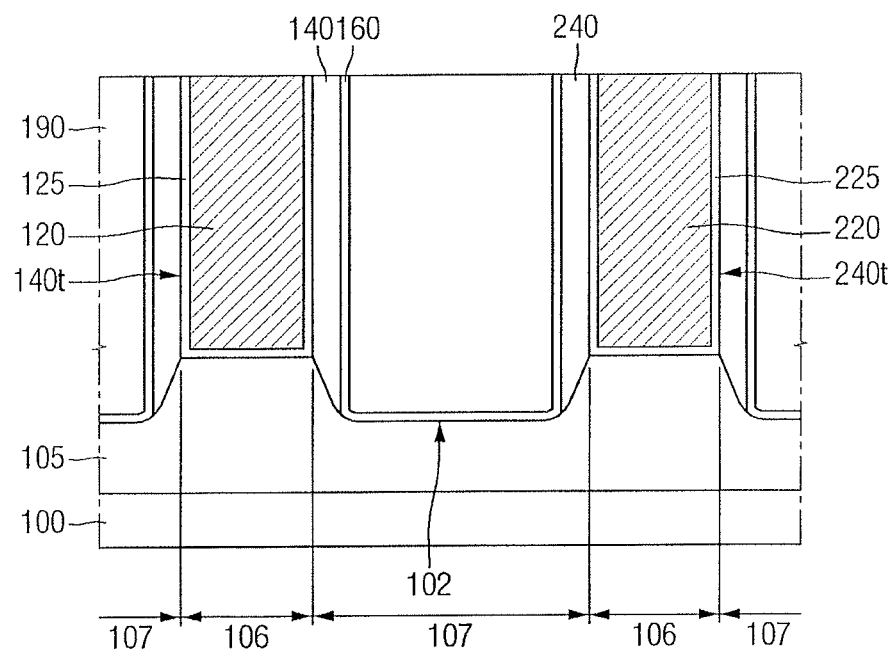
FIGS. 15 and 16 another embodiment of a semiconductor device.
Figure 16:
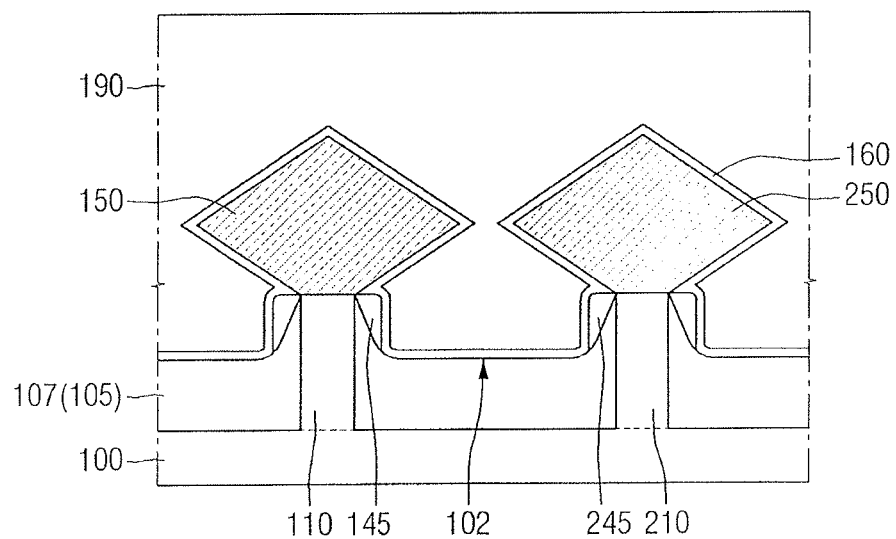

FIGS. 15 and 16 illustrate other embodiments of a semiconductor device. FIG. 15 is a cross sectional view taken on line C-C of FIG. 1, and FIG. 16 is a cross sectional view taken on line D-D of FIG. 1.

Referring to FIGS. 15 and 16, the first epitaxial pattern 150 and the second epitaxial pattern 250, which are disposed in a line along one sidewall of the first gate electrode 120, may not be in contact with each other. Further, the air gap may not be between the first epitaxial pattern 150 and the second epitaxial pattern 250, and the field insulating film 105. Thus, the air gap covered with the first epitaxial pattern 150 and the second epitaxial pattern 250 may not be formed.

As illustrated in FIG. 16, the etch-stop film 160 extending along the outer circumference of the first epitaxial pattern 150 may not be directly connected to the etch-stop film 160 extending along the outer circumference of the second epitaxial pattern 250. The etch-stop film 160 extending along the outer circumference of the first epitaxial pattern 150 may be connected to the etch-stop film 160 extending along the outer circumference of the second epitaxial pattern 250 with the etch-stop film 160 formed on the sidewall and the bottom surface of the first recess 102.

In the semiconductor device explained with reference to FIGS. 15 to 16, the first fin-type pattern 110 and the second fin-type pattern 210 may include the channel regions of the same type of the transistors or the channel regions of the different types of the transistors.

Figure 17:
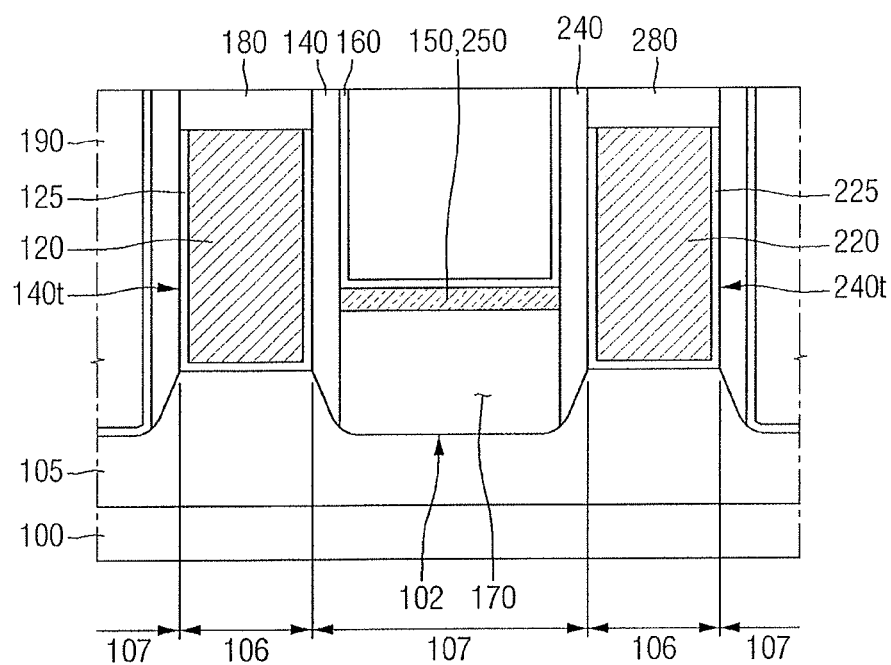
FIG. 17 illustrates another embodiment of a semiconductor device.

FIG. 17 illustrates another embodiment of a semiconductor device and corresponds to cross-sectional view taken on line C-C of FIG. 1. Referring to FIG. 17, the semiconductor device according to some exemplary embodiments may further include a first capping pattern 180 and a second capping pattern 280. The first gate electrode 120 may partially fill the first trench 140t. The first capping pattern 180 may be formed on the first gate electrode 120. The first capping pattern 180 may fill the rest of the first trench 140t remaining after the first gate electrode 120 is formed. The second gate electrode 220 may partially fill the second trench 240t. The second capping pattern 280 may be formed on the second gate electrode 220. The second capping pattern 280 may fill the rest of the second trench 240t remaining after the second gate electrode 220 is formed.

While FIG. 17 illustrates that the first gate insulating film 125 is not between the first gate spacer 140 and the first capping pattern 180, and the second gate insulating film 225 is not between the second gate spacer 240 and the second capping pattern 280, this is provided only for convenience of explanation and the exemplary embodiments are not limited thereto.

The upper surface of the first capping pattern 180 and the upper surface of the second capping pattern 280 may be respectively placed on the same plane as the upper surface of the interlayer insulating film 190. The first capping pattern 180 and the second capping pattern 280 may include, for example, a material having the etch selectivity to the lower interlayer insulating film 190. The first capping pattern 180 and the second capping pattern 280 may include at least one of silicon nitride (SiN), silicon oxynitride (SiON), silicon oxide (SiO$_2$), silicon carbon nitride (SiCN), silicon oxycarbon nitride (SiOCN), or a combination thereof.

Figure 18:
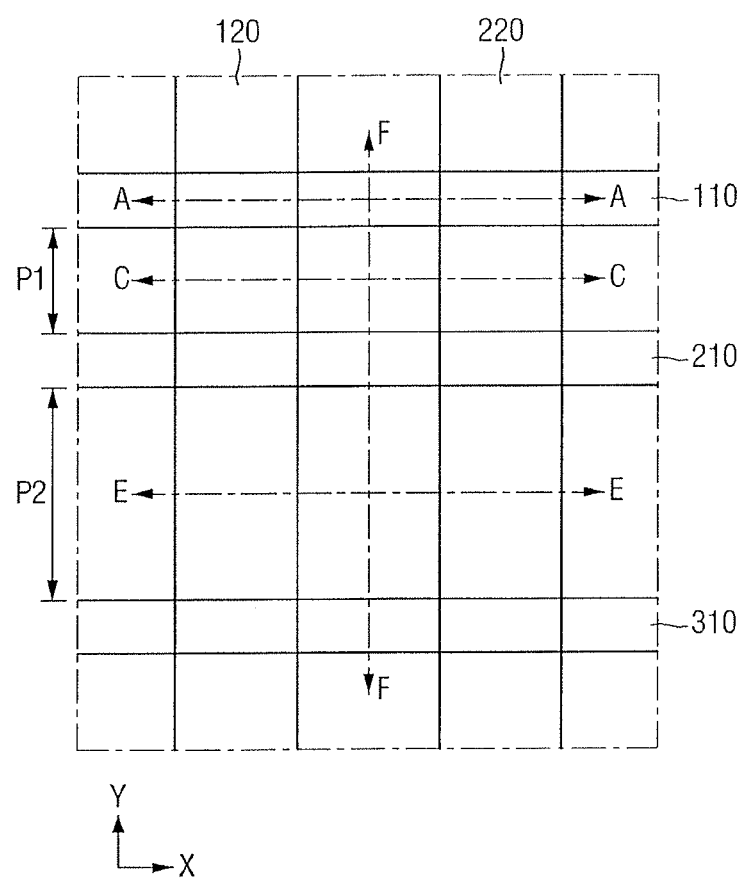
FIG. 18 illustrates another embodiment of a semiconductor device.
Figure 19:
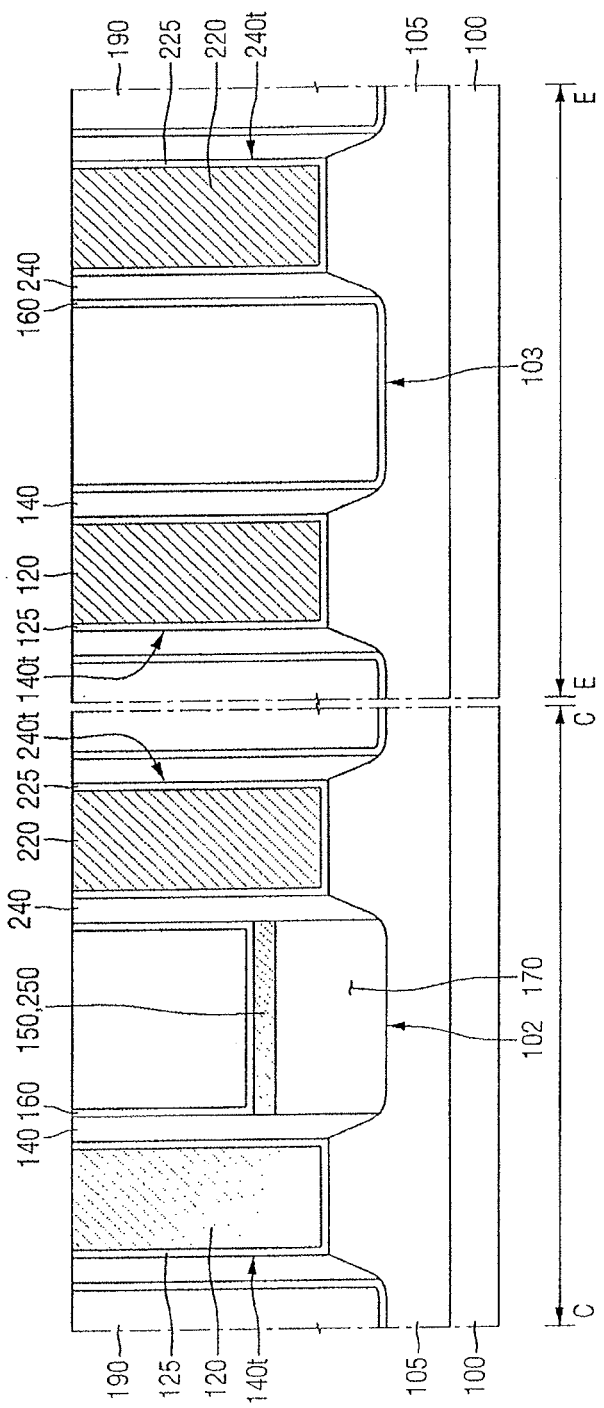
FIG. 19 illustrates a cross-sectional view of the semiconductor device in FIG. 18.
Figure 20:
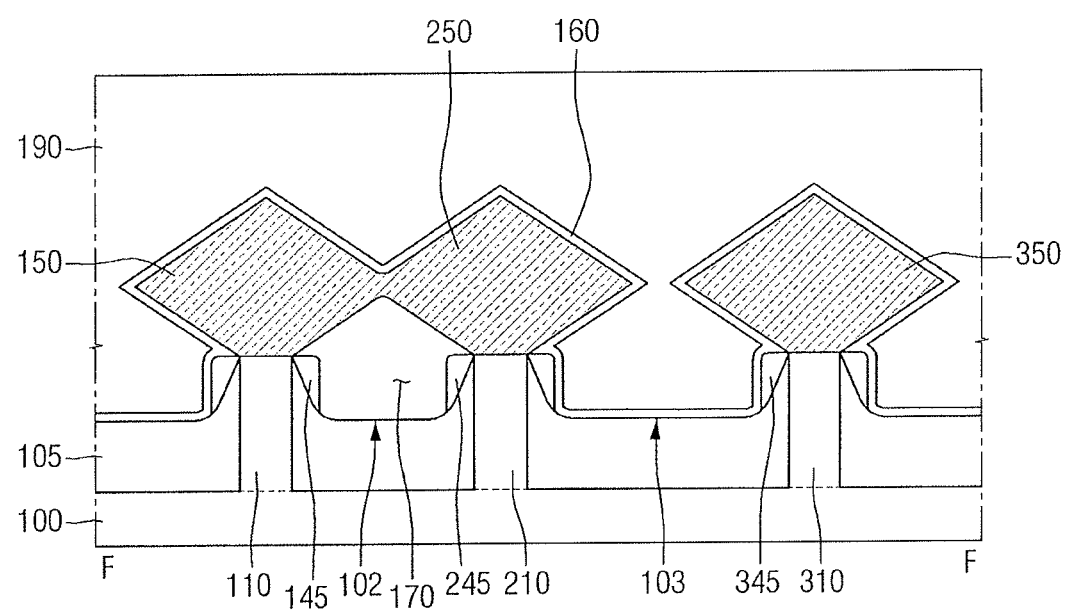
FIG. 20 illustrates another cross-sectional view of the semiconductor device in FIG. 18.

FIG. 18 illustrates a layout embodiment of a semiconductor device. FIG. 19 illustrates a cross-sectional view taken on lines C-C and E-E in FIG. 18. FIG. 20 illustrates a cross-sectional view taken on line F-F of FIG. 18. The cross-sectional view taken on line A-A of FIG. 18 may be substantially same as FIG. 2A or FIG. 2B. The cross sectional view taken on line B-B of FIG. 18 may be substantially same as FIG. 3A or FIG. 3B.

Referring to FIGS. 18 to 20, the semiconductor device may further include the third fin-type pattern 310 and the third epitaxial pattern 350. The third fin-type pattern 310 may extend longitudinally on the substrate 100 and in the first direction X. The third fin-type pattern 310 may protrude from the substrate 100.

The first to third fin-type patterns 110, 210, 310 may be adjacent to each other. The first to third fin-type patterns 110, 210, 310 may be parallel. The first to third fin-type patterns 110, 210, 310 may be arranged in the second direction Y. The second fin-type pattern 210 may be between the first fin-type pattern 110 and the third fin-type pattern 310. The long side of the first fin-type pattern 110 and the long side of the second fin-type pattern 210 may be faced each other. The long side of the second fin-type pattern 210 and the long side of the third fin-type pattern 310 may face each other. In this case, the first fin-type pattern 110 and the second fin-type pattern 210 may be displaced by a first pitch (P1), and the second fin-type pattern 210 and the third fin-type pattern 310 may be displaced by a second pitch (P2).

In the semiconductor device according to the some exemplary embodiments, the distance P1 by which the first fin-type pattern 110 and the second fin-type pattern 210 are displaced from each other may be less than the distance P2 by which the second fin-type pattern 210 and the third fin-type pattern 310 are displaced from each other.

In the semiconductor device explained with reference to FIGS. 18 to 20, the first fin-type pattern 110 and the second fin-type pattern 210 may include the channel regions of the same type of transistors. The second fin-type pattern 210 and the third fin-type pattern 310 may include the channel regions of the same type of the transistors or the channel regions of the different types of the transistors.

The field insulating film 105 may be formed on the substrate 100. The field insulating film 105 may be between the first fin-type pattern 110 and the second fin-type pattern 210 and between the second fin-type pattern 210 and the third fin-type pattern 310.

Similarly to FIGS. 3A and 3B, the field insulating film 105 may partially cover the third fin-type pattern 310. The field insulating film 105 may partially cover the sidewall of the third fin-type pattern 310.

The first gate electrode 120 and the second gate electrode 220 may respectively extend in the second direction Y. The first gate electrode 120 and the second gate electrode 220 may intersect the first to third fin-type patterns 110, 210, 310.

The first gate electrode 120 and the second gate electrode 220 may be formed respectively on the first fin-type pattern 110, the second fin-type pattern 210, the third fin-type pattern 310, and the field insulating film 105. The first gate electrode 120 and the second gate electrode 220 may surround the first to third fin-type patterns 110, 210, 310 which protrude higher than the upper surface of the first field insulating film 105.

The first recess 102 may be formed within the field insulating film 105 between the first fin-type pattern 110 and the second fin-type pattern 210 and between the first gate electrode 120 and the second gate electrode 220. The second recess 103 may be formed within the field insulating film 105 between the second fin-type pattern 210 and the third fin-type pattern 310 and between the first gate electrode 120 and the second gate electrode 220. Thus, the first recess 102 may be formed within the field insulating film 105 between the first fin-type pattern 110 and the second fin-type pattern 210 and on one side of the first gate electrode 120. Further, the second recess 103 may be formed within the field insulating film 105 between the second fin-type pattern 210 and the third fin-type pattern 310 and on one side of the first gate electrode 120.

Based on the second fin-type pattern 210, the first recess 102 may be adjacent to the first fin-type pattern 110 and the second recess 103 may be adjacent to the second fin-type pattern 210. The depth of the first recess 102 and the depth of the second recess 103 may be, for example, greater than or equal to 15 nm and less than or equal to 60 nm. The angle between the sidewall of the first recess 102 and the upper surface of the field insulating film 105 overlapping the first gate electrode 120 may be greater than 0 degree and less than or equal to 120 degrees on the uppermost portion of the first recess 102. The angle between the sidewall of the second recess 103 and the upper surface of the field insulating film 105 overlapping the first gate electrode 120 may be greater than 0 degree and less than or equal to 120 degrees on the uppermost portion of the second recess 103.

The first gate spacer 140 may be on the sidewall of the first gate electrode 120. The first gate spacer 140 may include the portion extending along the sidewall of the first recess 102 and the portion extended along the sidewall of the second recess 103.

The second gate spacer 240 may be formed on the sidewall of the second gate electrode 220. The second gate spacer 240 may include the portion extending along the sidewall of the first recess 102, and the portion extended along the sidewall of the second recess 103.

The third fin spacer 345 may be between the first gate electrode 120 and the second gate electrode 220 and on the sidewall of the third fin-type pattern 310. The third fin spacer 345 may be on the sidewall of the second recess 103.

One of the second fin spacers 245 may be formed on the sidewall of the first recess 102 and the other of the second fin spacers 245 may be formed on the sidewall of the second recess 103. The second fin spacer 245 and the third fin spacer 345 may be formed on the sidewall of the second recess 103 facing each other. A portion of the first gate spacer 140, a portion of the second gate spacer 240, the first fin spacer 145 and the second fin spacer 245 may be formed along the perimeter of the sidewall of the first recess 102. A portion of the first gate spacer 140, a portion of the second gate spacer 240, the second fin spacer 245 and the third fin spacer 345 may be formed along the perimeter of the sidewall of the second recess 103.

The third epitaxial pattern 350 may be between the first gate electrode 120 and the second gate electrode 220. The third epitaxial pattern 350 may be on the third fin-type pattern 310. The third epitaxial pattern 350 may be in the source/drain of the transistor using the third fin-type pattern 310 as channel region. The third epitaxial pattern 350 may be semiconductor pattern.

When the third fin-type pattern 310 includes the channel region of PMOS transistor, the third epitaxial pattern 350 may include the compressive stress materials. For example, the compressive stress material may be a material such as SiGe, which has a greater lattice constant than Si. For example, the compressive stress material may enhance the carrier mobility in the channel region by exerting the compressive stress on the third fin-type pattern 310.

When the third fin-type pattern 310 includes the channel region of NMOS transistor, the third epitaxial pattern 350 may include the tensile stress materials. For example, when the third fin-type pattern 310 is Si, the third epitaxial pattern 350 may be a material such as SiC, which has a smaller lattice constant than Si. For example, the tensile stress material may enhance the carrier mobility in the channel region by exerting the tensile stress on the third fin-type pattern 310. In one embodiment, when the third fin-type pattern 310 is Si, the third epitaxial pattern 350 may be a silicon epitaxial pattern.

In the semiconductor device according to the some exemplary embodiments, the first epitaxial pattern 150 and the second epitaxial pattern 250 may be in contact with each other, but the second epitaxial pattern 250 and the third epitaxial pattern 350 may not be in contact with each other. The first epitaxial pattern 150 and the second epitaxial pattern 250, which are in contact with each other, may be disposed in a line along one sidewall of the first gate electrode 120. The second epitaxial pattern 250 and the third epitaxial pattern 350 which are not in contact with each other may also be disposed in a line along one sidewall of the first gate electrode 120.

The first air gap 170 may be formed on the field insulating film 105 between the first fin-type pattern 110 and the second fin-type pattern 210. The first air gap 170 may be covered with the first epitaxial pattern 150 and the second epitaxial pattern 250 which are in contact with each other.

However, an air gap may not be formed on the field insulating film 105 between the second fin-type pattern 210 and the third fin-type pattern 310 which are adjacent to each other. For example, the air gap covered with the second epitaxial pattern 250 and the third epitaxial pattern 350 may not be formed on the field insulating film 105 between the second fin-type pattern 210 and the third fin-type pattern 310 which are adjacent to each other.

The etch-stop film 160 may not be formed on the sidewall and the bottom surface of the first recess 102 between the first fin-type pattern 110 and the second fin-type pattern 210 and between the first gate electrode 120 and the second gate electrode 220. However, the etch-stop film 160 may be formed on the sidewall and the bottom surface of the second recess 103 between the second fin-type pattern 210 and the third fin-type pattern 310 and between the first gate electrode 120 and the second gate electrode 220. The first air gap 170 may be within the first recess 102, but no air gap is within the second recess 103.

Although FIGS. 18 to 20 describe that the first to third fin-type patterns 110, 210, 310 are adjacent to each other, the exemplary embodiments are not limited thereto.

Thus, the substrate 100 may include the first region and the second region displaced from each other. Even when the fin-type patterns displaced by the first pitch P1 are formed on the first region and the fin-type patterns displaced by the second pitch P2, which is greater than the first pitch P1, are formed on the second region, the exemplary embodiments explained with reference to FIGS. 18 to 20 can be obviously applied.

Figure 21:
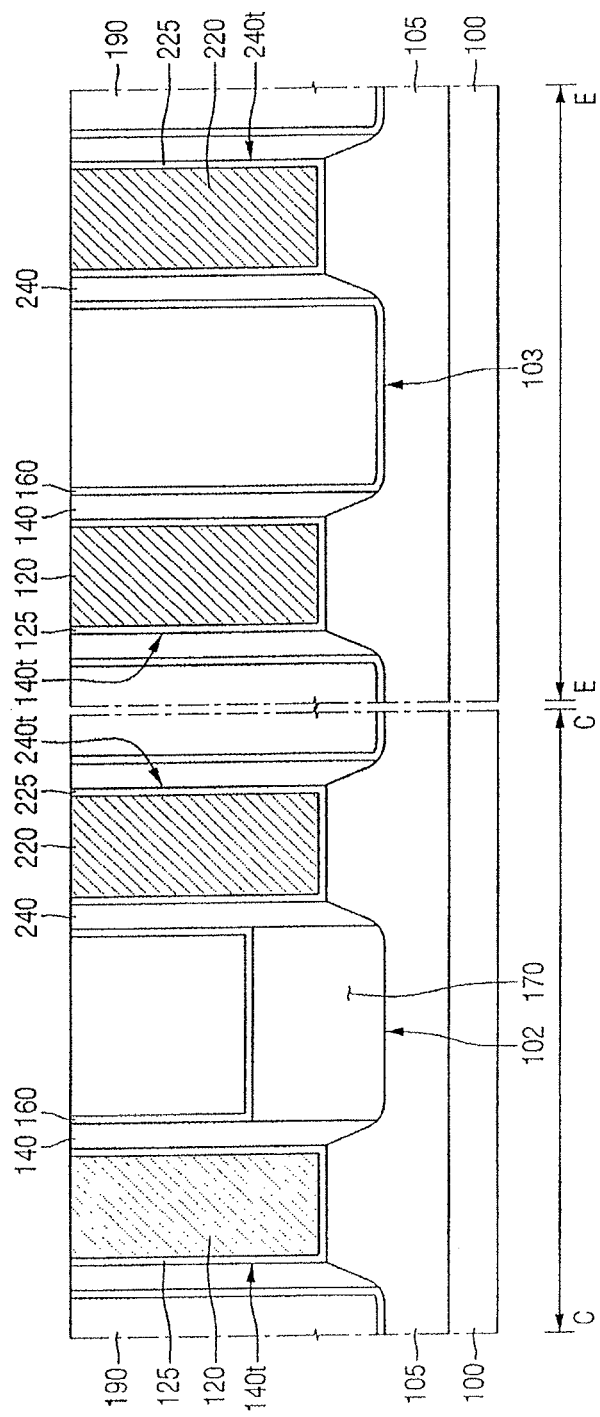
FIGS. 21 and 22 illustrate another embodiment of a semiconductor device.
Figure 22:
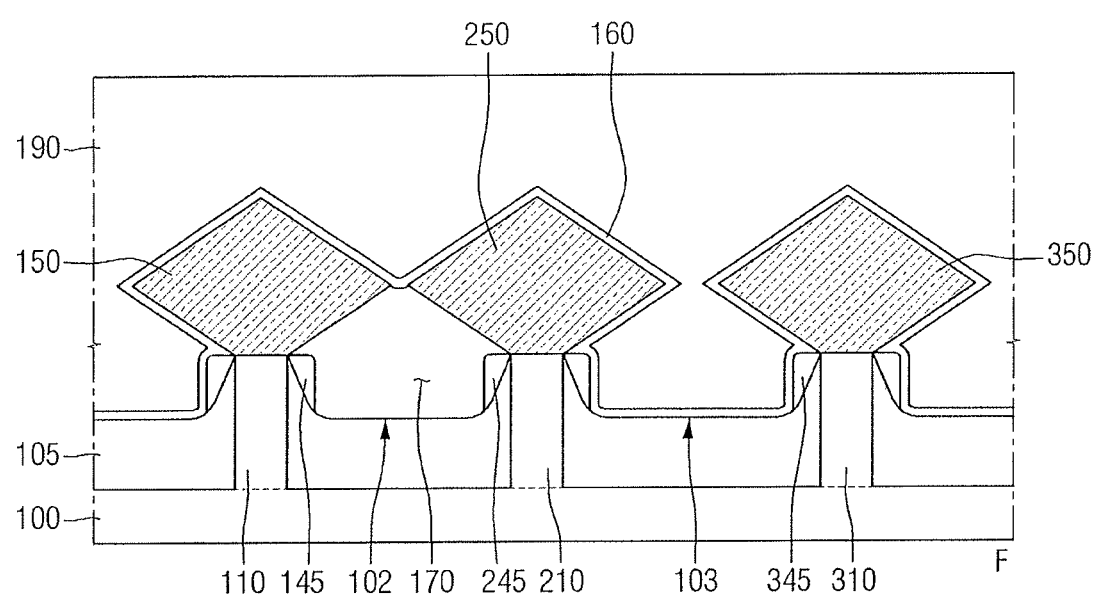
Figure 23:
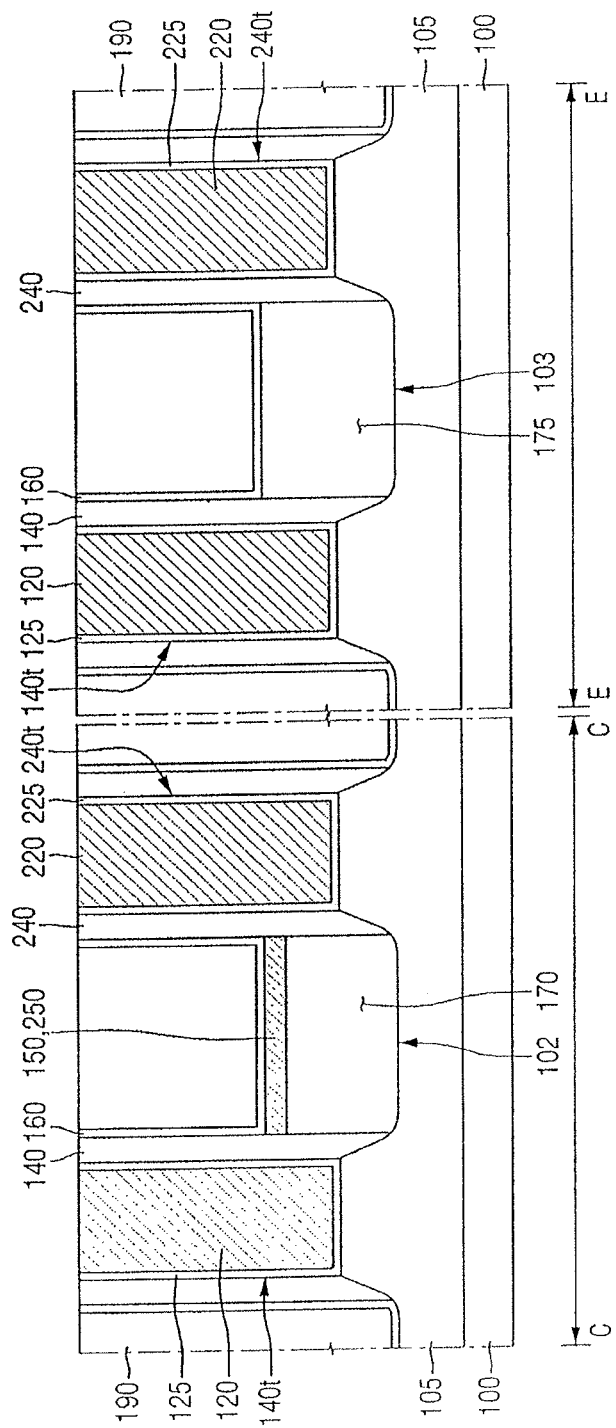
FIGS. 23 and 24 illustrate another embodiment of a semiconductor device.
Figure 24:
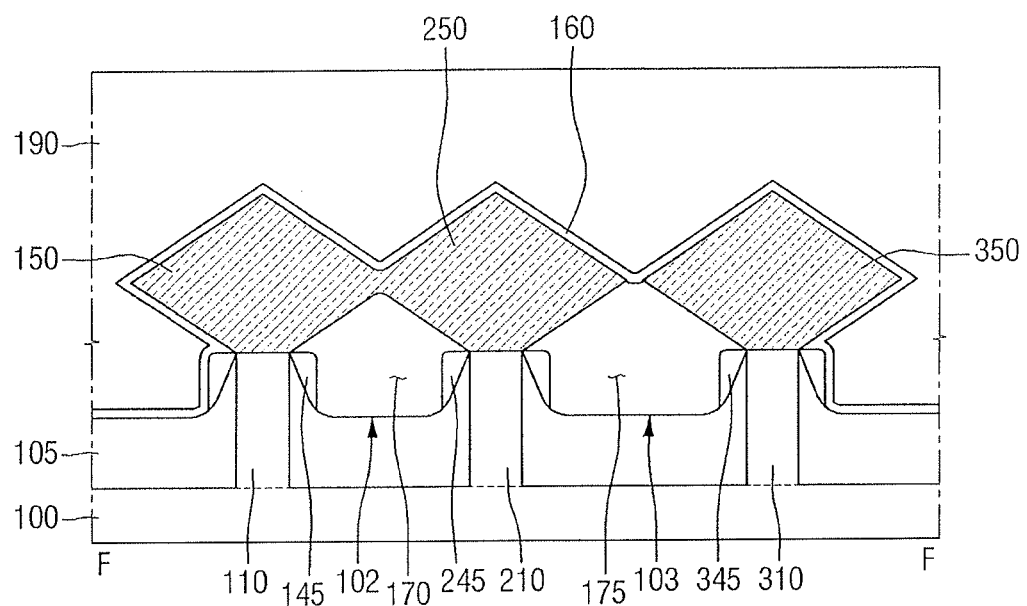

FIGS. 21 to 24 illustrate other embodiments of a semiconductor device. FIGS. 21 and 23 are cross-sectional views taken on line C-C and E-E of FIG. 18. FIGS. 22 and 24 are cross-sectional views taken on line F-F of FIG. 18.

Referring to FIGS. 21 and 22, the first epitaxial pattern 150 and the second epitaxial pattern 250, which are arranged in a line along one sidewall of the first gate electrode 120, may not be in contact with each other. However, the first air gap 170 may be between the first epitaxial pattern 150 and the second epitaxial pattern 250, and the field insulating film 105. Even though the first epitaxial pattern 150 and the second epitaxial pattern 250 are not in contact with each other, the first air gap 170 may be formed on field insulating film 105 between the first fin-type pattern 110 and the second fin-type pattern 210 by etch-stop film 160. The first air gap 170 may be covered with the first epitaxial pattern 150 and the second epitaxial pattern 250, and the etch-stop film 160 which are not in contact with each other.

Referring to FIGS. 23 and 24, the semiconductor device may further include the second air gap 175 on the field insulating film 105 between the second fin-type pattern 210 and the third fin-type pattern 310 which are adjacent to each other. The second epitaxial pattern 250 and the third epitaxial pattern 350, which are disposed in a line along one sidewall of the first gate electrode 120, may not be in contact with each other. However, the second air gap 175 may be between the second epitaxial pattern 250 and the third epitaxial pattern 350, and the field insulating film 105.

Even though the second epitaxial pattern 250 and the third epitaxial pattern 350 are not in contact with each other, the second air gap 175 may be formed on the field insulating film 105 between the second fin-type pattern 210 and the third fin-type pattern 310 by etch-stop film 160. The second air gap 175 may be covered with the second epitaxial pattern 250 and the third epitaxial pattern 350 which are not in contact with each other, and the etch-stop film 160. The first air gap 170 may be defined within the first recess 102 and the second air gap 175 may be within the second recess 103.

Figure 25:
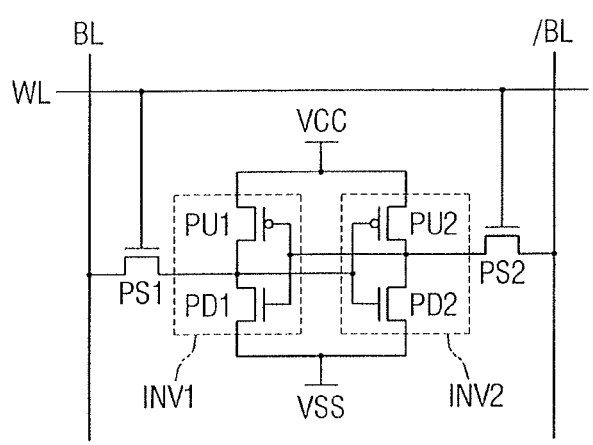
FIG. 25 illustrates another embodiment of a semiconductor device.
Figure 26:
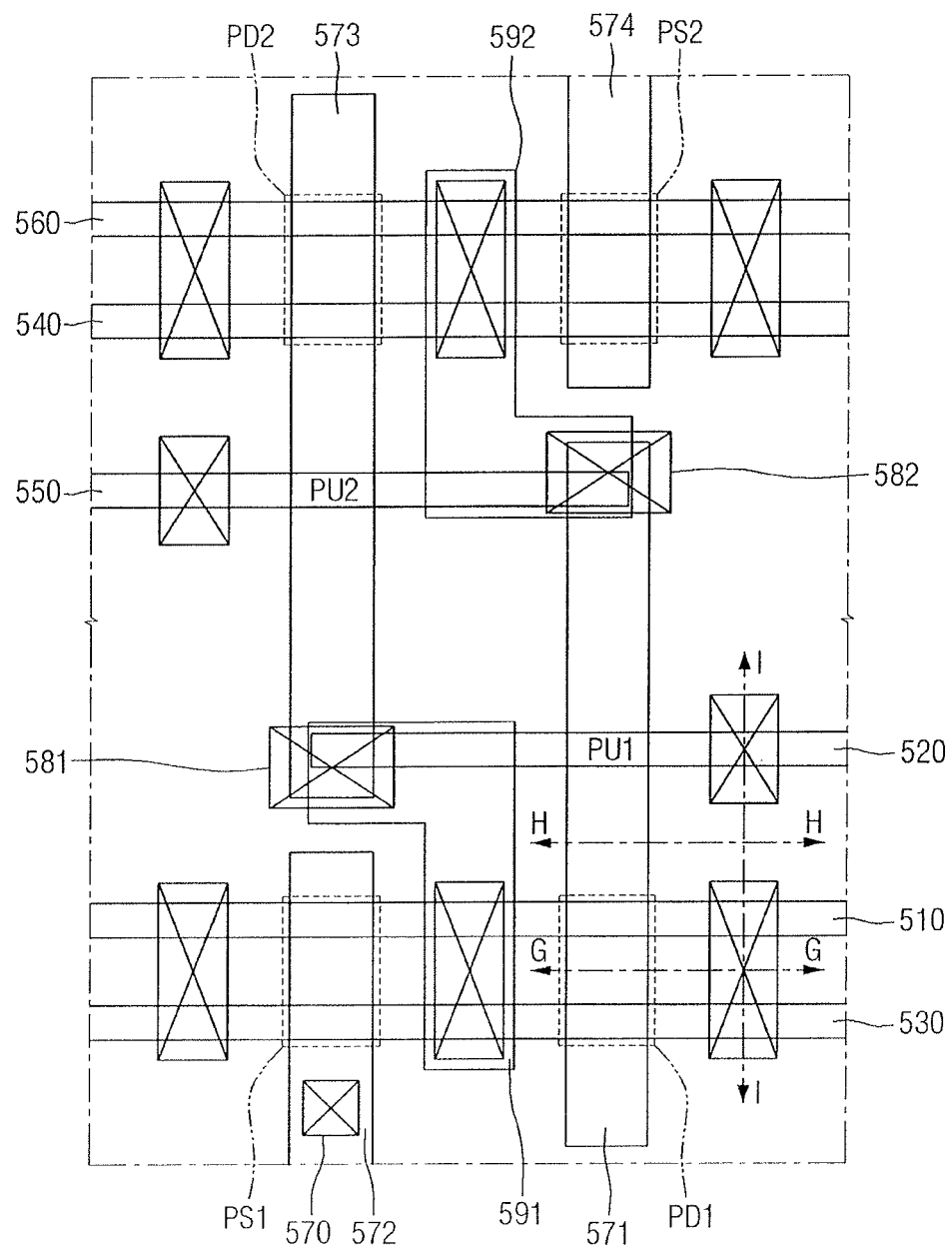
FIG. 26 illustrates a layout embodiment of the semiconductor device in FIG. 25.

FIG. 25 illustrates an embodiment of a circuit of a semiconductor device. FIG. 26 illustrates a layout embodiment of the semiconductor device in FIG. 25.

Referring to FIG. 25, the semiconductor device may include a pair of inverters INV1 and INV2 connected to each other in parallel between a power supply node Vcc and a ground node Vss, and a first pass transistor PS1 and a second pass transistor PS2 respectively connected to output nodes of the inverters INV1 and INV2. The first pass transistor PS1 and the second pass transistor PS2 may be connected to a bit line BL and a complementary bit line/BL, respectively. The gates of the first pass transistor PS1 and the second pass transistor PS2 may be connected to a word line WL.

The first inverter INV1 includes a first pull-up transistor PU1 and a first pull-down transistor PD1 connected in series. The second inverter INV2 includes a second pull-up transistor PU2 and a second pull-down transistor PD2 connected in series. The first pull-up transistor PU1 and the second pull-up transistor PU2 may be PFET transistors. The first pull-down transistor PD and the second pull-down transistor PD2 may be NFET transistors. Further, in order for the first inverter INV1 and the second inverter INV2 to construct one latch circuit, the input node of the first inverter INV1 is connected to the output node of the second inverter INV2. The input node of the second inverter INV2 is connected to the output node of the first inverter INV1.

Referring to FIGS. 25 and 26, a first active region 510, a second active region 520, a third active region 530, a fourth active region 540, a fifth active region 550, and a sixth active region 560 which are displaced from one another may be respectively formed to extend longitudinally in one direction (e.g., a horizontal direction of FIG. 26). The second active region 520 and the fifth active region 550 may extend shorter than the first active region 510, the third active region 530, the fourth active region 540 and the sixth active region 560.

Further, a first gate line 571, a second gate line 572, a third gate line 573, and a fourth gate line 574 may extend longitudinally in the other direction (e.g., vertical direction of FIG. 26) and may intersect the first active region 510 to the sixth active region 560. For example, the first gate line 571 may entirely intersect the first to third active regions 510, 520, 530, and may partially overlap an end of the fifth active region 550. The third gate line 573 may entirely intersect the fourth to sixth active regions 540, 550, 560 and may partially overlap an end of the second active region 520. The second gate line 572 may intersect the first active region 510 and the third active region 530. The fourth gate line 574 may intersect the fourth active region 540 and the sixth active region 560.

As illustrated, the first pull-up transistor PU1 may be near the intersecting region of the first gate line 571 and the second active region 520. The first pull-down transistor PD1 may be near the intersecting region of the first gate line 571 and the first active region 510 and the third active region 530. The first pass transistor PS1 may be near the intersecting region of the second gate line 572 and the first active region 510 and the third active region 530.

The second pull-up transistor PU2 may be near the intersecting region of the third gate line 573 and the fifth active region 550. The second pull-down transistor PD2 may be near the intersecting region of the third gate line 573 and the fourth active region 540 and the sixth active region 560. The second pass transistor PS2 may be near the intersecting region of the fourth gate line 574 and the fourth active region 540 and the sixth active region 560.

The source/drain may be on different sides of the intersecting regions of the first to fourth gate lines 571-574 and the first to sixth active regions 510, 520, 530, 540, 550, 560, and a plurality of contacts 570 may be formed. Furthermore, the first shared contact 581 may connect the second active region 520, the third gate line 573 and a wiring 591 simultaneously. The second shared contact 582 may connect the fifth active region 550, the first gate line 571 and the wiring 592 simultaneously.

Even though FIG. 26 illustrates that the pull-down transistors PD1, PD2 and the pass transistors PS1, PS2 which are n-type transistors are defined near a plurality of the active regions, exemplary embodiments may not be limited thereto.

Referring to FIGS. 18 and 26, the third active region 530 may correspond to the first fin-type pattern 110, the first active region 510 may correspond to the second fin-type pattern 210, and the second active region 520 may correspond to the third fin-type pattern 310. The first gate line 571 may correspond to the first gate electrode 120. When the contacts in FIG. 26 are excluded, the sectional view taken on line G-G of FIG. 26 may be similar to the sectional view taken on line C-C of FIG. 18, and the sectional view taken on line H-H of FIG. 26 may be similar to the sectional view taken on line E-E of FIG. 18. Further, the sectional view taken on line I-I of FIG. 26 may be similar to the sectional view taken on line F-F of FIG. 18.

Thus, the third fin-type pattern 310 may be on PMOS region of SRAM, and the first fin-type pattern 110 and the second fin-type pattern 210 may be on NMOS region of SRAM.

Figure 27:
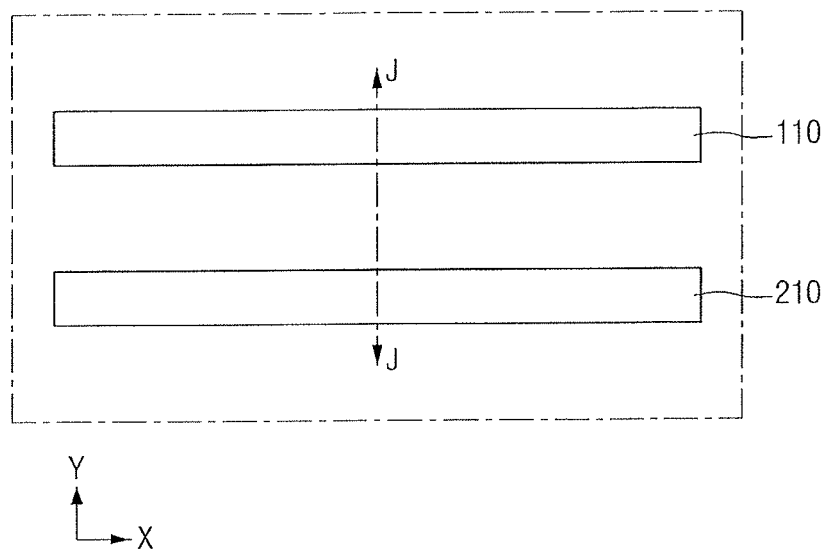
FIGS. 27 to 34 illustrate various stages of an embodiment of a method for fabricating a semiconductor device.
Figure 28:
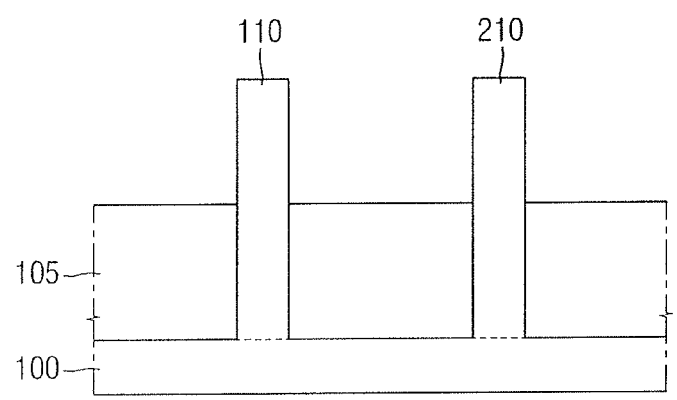
Figure 29:
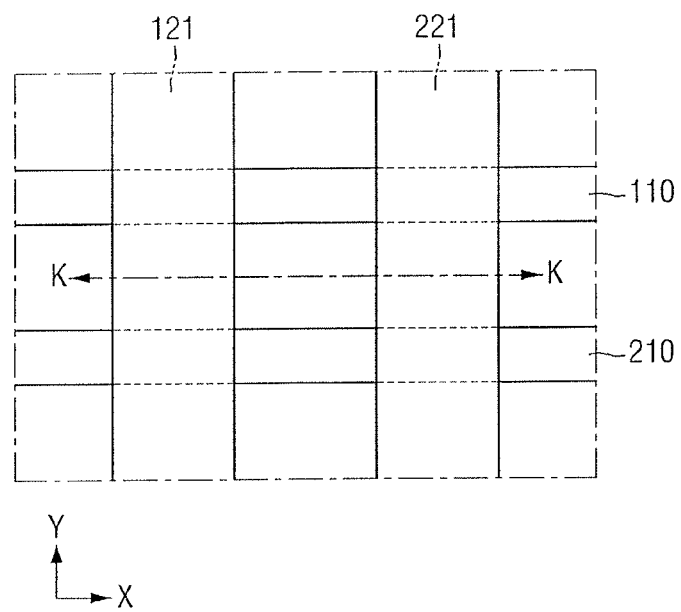
Figure 30:
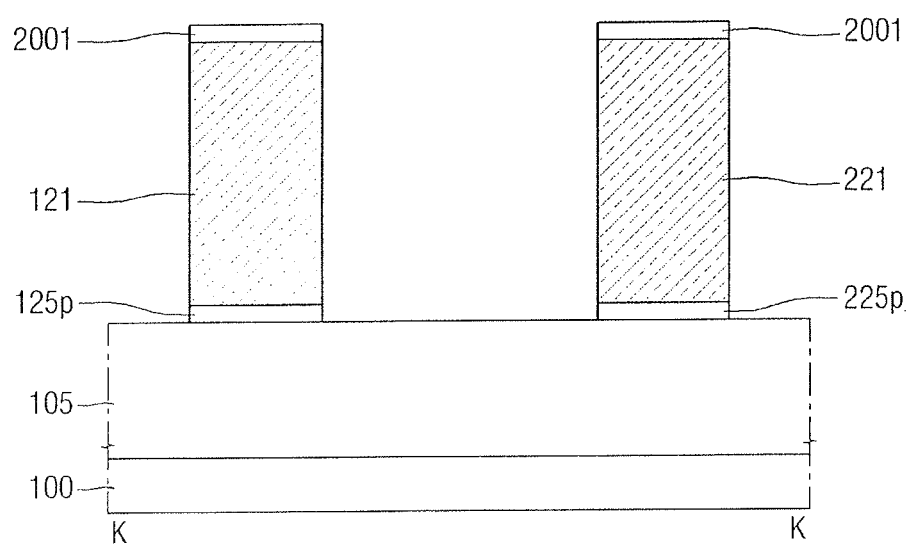

FIGS. 27 to 34 illustrate various stages of a method for fabricating a semiconductor device. FIG. 28 illustrates a cross-sectional view taken on line J-J of FIG. 27, and FIG. 30 is a cross-sectional view taken on line K-K of FIG. 29.

Referring to FIGS. 27 and 28, the first fin-type pattern 110 and the second fin-type pattern 210 extending in the first direction X may be formed on the substrate 100. The first fin-type pattern 110 and the second fin-type pattern 210 may be formed in parallel and arranged in the second direction Y.

The field insulating film 105 may be formed to partially cover the first fin-type pattern 110 and the second fin-type pattern 210 on the substrate 100. The field insulating film 105 may be formed between the first fin-type pattern 110 and the second fin-type pattern 210. The field insulating film 105 may partially cover the sidewall of the first fin-type pattern 110 and the sidewall of the second fin-type pattern 210. The upper surface of the first fin-type pattern 110 and the upper surface of the second fin-type pattern 210 may protrude upward higher than the upper surface of the field insulating film 105.

Referring to FIGS. 29 and 30, a first dummy gate electrode 121 and a second dummy gate electrode 221 intersecting the first fin-type pattern 110 and the second fin-type pattern 210 may be formed on the field insulating film 105. The first dummy gate electrode 121 and the second dummy gate electrode 221 may be formed on the field insulating film 105 by performing the etch process with the mask pattern 2001. The first dummy gate electrode 121 and the second dummy gate electrode 221 may be respectively extended and formed in the second direction Y.

A first dummy gate insulating film 125p may be formed between the first dummy gate electrode 121 and the field insulating film 105. The second dummy gate insulating film 225p may be formed between the second dummy gate electrode 221 and the field insulating film 105. The first dummy gate insulating film 125p and the second dummy gate insulating film 225p may be formed also on the first fin-type pattern 110 and the second fin-type pattern 210, respectively. The first and second dummy gate electrodes 121, 221 may respectively include, for example, polysilicon or amorphous silicon.

Figure 31:
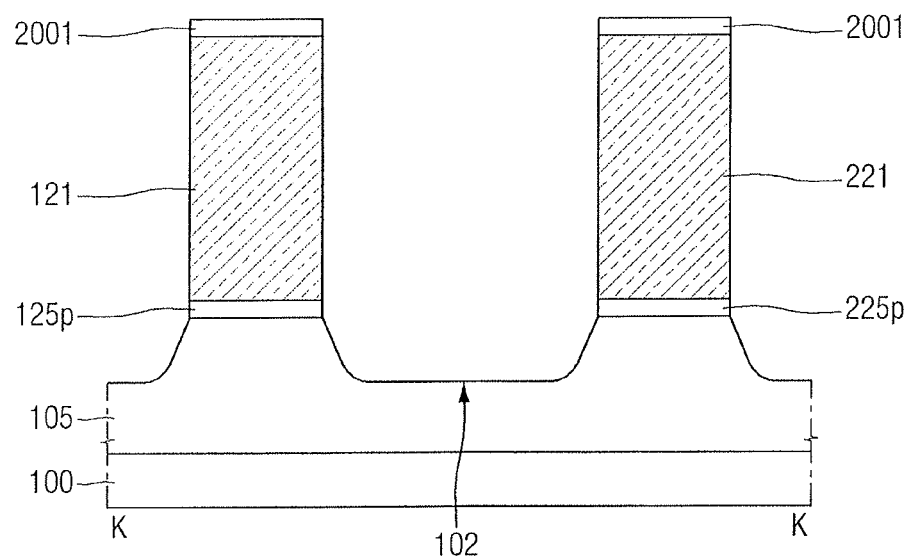

Referring to FIG. 31, a portion of the field insulating film 105 may be removed using the first dummy gate electrode 121 and second dummy gate electrode 221 as masks. The first recess 102 may be formed within field insulating film 105 by removing a portion of the field insulating film 105. The first recess 102 may be formed using the etch process, for example. Further, an inclination of the sidewall of the first recess 102 may be adjusted on the uppermost portion of the first recess 102 by adjusting the process variables such as time of the etch process, the concentration of the etchant, and so on for forming the first recess 102.

Figure 32:
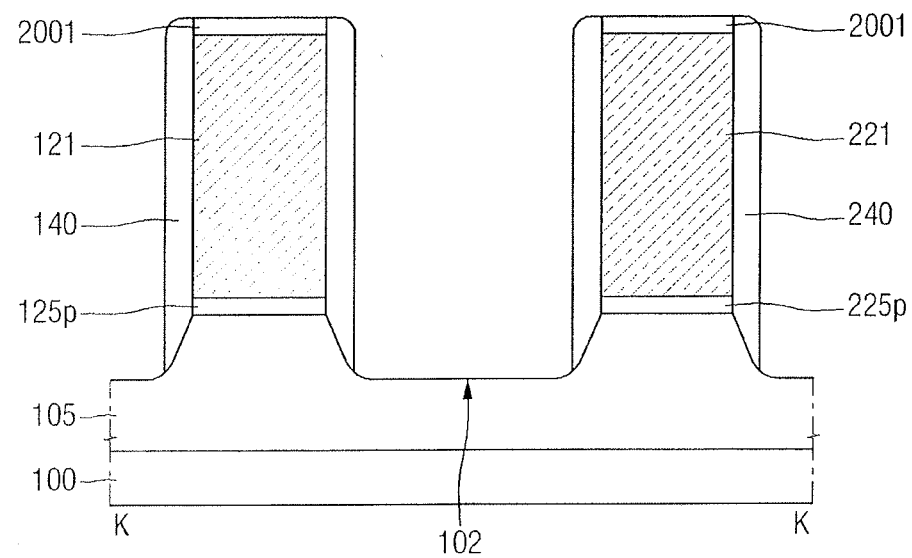

Referring to FIG. 32, the first gate spacer 140 may be formed along the sidewall of the first dummy gate electrode 121 and the sidewall of the first recess 102. The second gate spacer 240 may be formed along the sidewall of the second dummy gate electrode 221 and the sidewall of the first recess 102. While the first gate spacer 140 and the second gate spacer 240 are formed, the first fin spacer (e.g., 145 of FIG. 5) and the second fin spacer 245 may be also formed, for example, on the sidewalls of the first fin-type pattern 110 and the second fin-type pattern 210.

The trench to form the first epitaxial pattern 150 may be formed by removing the first fin-type pattern 110 between the first gate spacer 140 and the second gate spacer 240, as in FIGS. 2A and 2B. The trench to form the second epitaxial pattern 250 may be formed by removing the second fin-type pattern 210 between the first gate spacer 140 and the second gate spacer 240.

Figure 33:
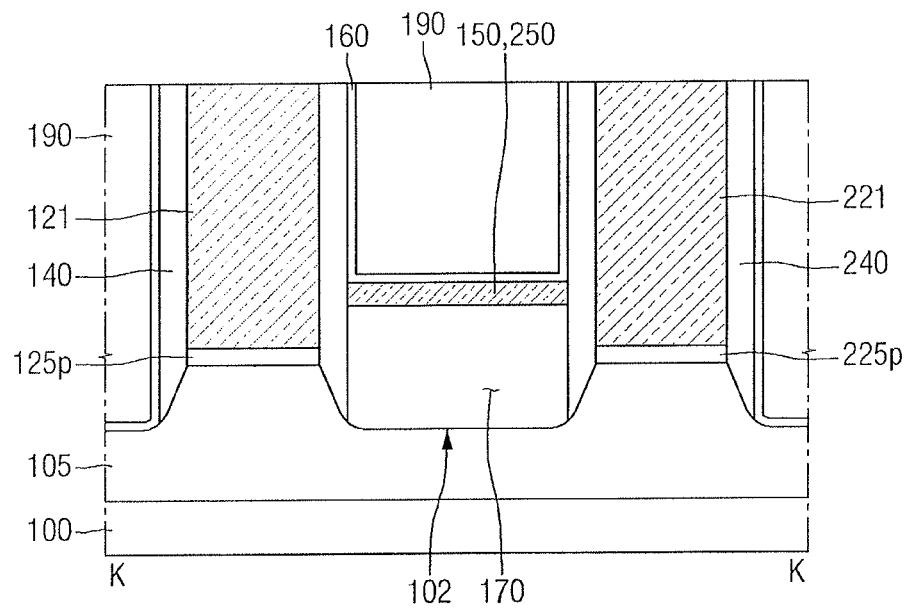

Referring to FIG. 33, the first epitaxial pattern 150 and the second epitaxial pattern 250 may be formed on the first fin-type pattern 110 and the second fin-type pattern 210. The etch-stop film 160 may be formed on the first epitaxial pattern 150 and the second epitaxial pattern 250. The etch-stop film 160 may be also formed on the first dummy gate electrode 121 and the second dummy gate electrode 221.

The interlayer insulating film 190 may then be formed on the field insulating film 105 in which the etch-stop film 160 is formed. The interlayer insulating film 190 may cover the first dummy gate electrode 121 and the second dummy gate electrode 221. By planarizing the interlayer insulating film 190, the upper surface of the first dummy gate electrode 121 and the upper surface of the second dummy gate electrode 221 may be exposed. During the planarization of the interlayer insulating film 190, the mask pattern 2001 may be removed.

Through the above process, the interlayer insulating film 190, which surrounds the outer sidewall of the first gate spacer 140 and the outer sidewall of the second gate spacer 240 and exposes the upper surface of the first dummy gate electrode 121 and the upper surface of the second dummy gate electrode 221, may be formed.

Figure 34:
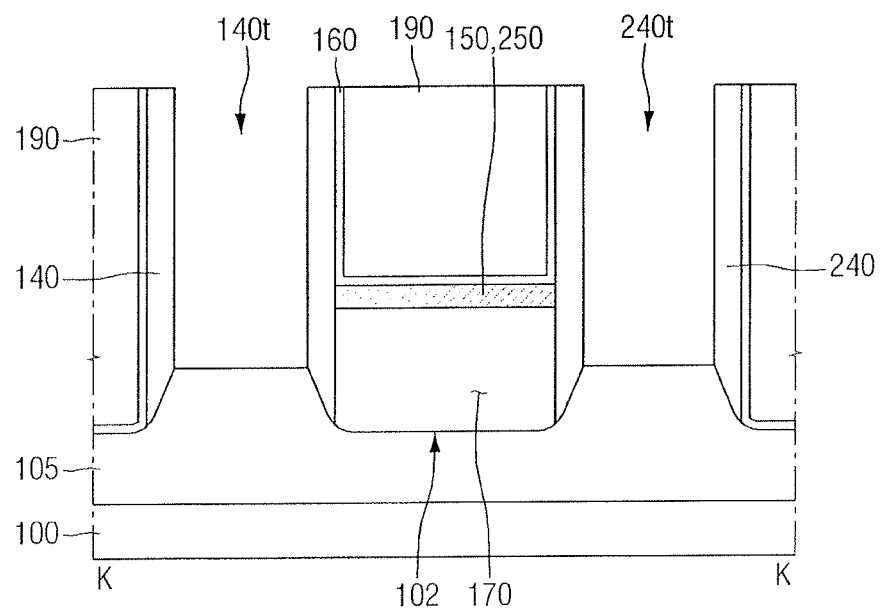

Referring to FIG. 34, the first trench 140t may be formed within the interlayer insulating film 190 by removing the first dummy gate electrode 121 and the first dummy gate insulating film 125p. The second trench 240t may be formed within the interlayer insulating film 190 by removing the second dummy gate electrode 221 and the second dummy gate insulating film 225p.

Next, referring to FIG. 4, the first gate insulating film 125 along the sidewall and the bottom surface of the first trench 140t and the second gate insulating film 225 along the sidewall and the bottom surface of the second trench 240t may be formed. The first gate electrode 120 filling the first trench 140t may be formed on the first gate insulating film 125. The second gate electrode 220 filling the second trench 240t may be formed on the second gate insulating film 225.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a first fin-type pattern and a second fin-type pattern adjacent to each other on a substrate;
   a field insulating film covering a portion of the first fin-type pattern and a portion of the second fin-type pattern and on the substrate between the first fin-type pattern and the second fin-type pattern;
   a recess in the field insulating film and including a first sidewall and a second sidewall;
   a first fin spacer on the first sidewall of the recess and a sidewall of the first fin-type pattern, a top of the first fin spacer being at a same height as a top of the first fin-type pattern;
   a second fin spacer on the second sidewall of the recess and a sidewall of the second fin-type pattern, a top of the second fin spacer being at a same height as a top of the second fin-type pattern;
   a first epitaxial pattern on the first fin-type pattern; and
   a second epitaxial pattern on the second fin-type pattern.

2. The semiconductor device as claimed in claim 1, further comprising:
   a first gate electrode and a second gate electrode on the field insulating film and intersecting the first fin-type pattern and the second fin-type pattern, the first gate electrode adjacent to the second gate electrode.

3. The semiconductor device as claimed in claim 2, further comprising:
   a first gate spacer on a third sidewall of the recess and a sidewall of the first gate electrode; and
   a second gate spacer on a fourth sidewall of the recess and a side wall of the second gate electrode.

4. The semiconductor device as claimed in claim 3, wherein a height of the first and second gate spacers is greater than a height of the first and second fin spacers.

5. The semiconductor device as claimed in claim 3, further comprising:
   an etch-stop film on the first epitaxial pattern and the second epitaxial pattern; and
   an air gap surrounded by the first and second fin spacers, the first and second gate spacers, the etch-stop film, the first epitaxial pattern, and the second epitaxial pattern.

6. The semiconductor device as claimed in claim 1, wherein the first and second fin spacer are not on at least a portion of a bottom surface of the recess.

7. The semiconductor device as claimed in claim 1, wherein the first epitaxial pattern is in contact with the second epitaxial pattern.

8. The semiconductor device as claimed in claim 1, wherein the first epitaxial pattern does not contact the second epitaxial pattern.

9. The semiconductor device as claimed in claim 1, wherein the recess is between the first fin-type pattern and the second fin-type pattern.

10. A semiconductor device, comprising:
    a first fin-type pattern and a second fin-type pattern adjacent to each other on a substrate;
    a field insulating film covering a portion of the first fin-type pattern and a portion of the second fin-type pattern and on the substrate between the first fin-type pattern and the second fin-type pattern;
    a first gate electrode and a second gate electrode on the field insulating film and intersecting the first fin-type pattern and the second fin-type pattern, the first gate electrode adjacent to the second gate electrode;

a recess in the field insulating film between the first gate electrode and the second gate electrode;

a liner on a sidewall of the recess and including a first gate spacer, a second gate spacer, a first fin spacer and a second fin spacer, the first and second gate spacers on a sidewall of the first gate electrode and a sidewall of the second gate electrode, respectively, and the first and second fin spacers on a sidewall of the first fin-type pattern and a sidewall of the second fin-type pattern, respectively;

a first epitaxial pattern on the first fin-type pattern between the first gate electrode and the second gate electrode; and a second epitaxial pattern on the second fin-type pattern between the first gate electrode and the second gate electrode.

11. The semiconductor device as claimed in claim 10, wherein the liner is not on at least a portion of a bottom surface of the recess.

12. The semiconductor device as claimed in claim 10, wherein a height of the first and second gate spacers is greater than a height of the first and second fin spacers.

13. The semiconductor device as claimed in claim 10, further comprising:
an air gap surrounded by the first and second gate spacers, the first and second fin spacers, the first epitaxial pattern, and the second epitaxial pattern.

14. The semiconductor device as claimed in claim 10, further comprising:
an etch-stop film on the first epitaxial pattern and the second epitaxial pattern; and
an air gap surrounded by the first and second gate spacers, the first and second fin spacers, the etch-stop film, the first epitaxial pattern, and the second epitaxial pattern.

15. The semiconductor device as claimed in claim 14, wherein the first epitaxial pattern does not contact the second epitaxial pattern.

16. A semiconductor device, comprising:
a first fin-type pattern adjacent to a second fin-type pattern on a substrate;
a third fin-type pattern between the first fin-type pattern and the second fin-type pattern on the substrate, a distance between the third fin-type pattern and the first fin-type pattern greater than a distance between the third fin-type pattern and the second fin-type pattern;
a field insulating film covering a portion of the first fin-type pattern, a portion of the second fin-type pattern, and a portion of the third fin-type pattern, on the substrate between the first fin-type pattern and the second fin-type pattern and between the second fin-type pattern and the third fin-type pattern;
a gate electrode on the field insulating film and intersecting the first to third fin-type patterns;
a first recess in the field insulating film between the first fin-type pattern and the third fin-type pattern;
a second recess in the field insulating film between the second fin-type pattern and the third fin-type pattern;
a gate spacer extending along a sidewall of the gate electrode, a sidewall of the first recess, and a sidewall of the second recess;
a first epitaxial pattern on the first fin-type pattern;
a second epitaxial pattern on the second fin-type pattern; and
a third epitaxial pattern on the third fin-type pattern.

17. The semiconductor device as claimed in claim 16, further comprising:
an air gap covered by the second epitaxial pattern and the third epitaxial pattern on the field insulating film between the second fin-type pattern and the third fin-type pattern, wherein an air gap covered with the first epitaxial pattern and the third epitaxial pattern is not on the field insulating film between the first fin-type pattern and the third fin-type pattern.

18. The semiconductor device as claimed in claim 16, further comprising:
a first air gap covered by the first epitaxial pattern and the third epitaxial pattern on the field insulating film between the first fin-type pattern and the third fin-type pattern; and
a second air gap covered by the second epitaxial pattern and the third epitaxial pattern, on the field insulating film between the second fin-type pattern and the third fin-type pattern.

19. The semiconductor device as claimed in claim 16, wherein:
the second epitaxial pattern is in contact with the third epitaxial pattern, and
the first epitaxial pattern is not in contact with the third epitaxial pattern.

20. The semiconductor device as claimed in claim 16, wherein:
the first fin-type pattern is in PMOS region of an SRAM, and
the second fin-type pattern and the third fin-type pattern are in NMOS region of the SRAM.

* * * * *